(12) United States Patent
Moore et al.

(10) Patent No.: US 11,523,599 B2
(45) Date of Patent: Dec. 13, 2022

(54) ARTHROPOD DETECTION

(71) Applicant: COMMONWEALTH SCIENTIFIC AND INDUSTRIAL RESEARCH ORGANISATION, Acton (AU)

(72) Inventors: Darren Craig Moore, Acton (AU); Nancy Schellhorn, Acton (AU); Stephen John Brosnan, Kenmore (AU)

(73) Assignee: COMMONWEALTH SCIENTIFIC AND INDUSTRIAL RESEARCH ORGANISATION, Acton (AU)

( * ) Notice: Subject to any disclaimer, the term of this patent is extended or adjusted under 35 U.S.C. 154(b) by 811 days.

(21) Appl. No.: 16/340,912

(22) PCT Filed: Oct. 12, 2017

(86) PCT No.: PCT/AU2017/051104
§ 371 (c)(1),
(2) Date: Apr. 10, 2019

(87) PCT Pub. No.: WO2018/068092
PCT Pub. Date: Apr. 19, 2018

(65) Prior Publication Data
US 2019/0239498 A1    Aug. 8, 2019

(30) Foreign Application Priority Data

Oct. 12, 2016 (AU) .............................. 2016904141

(51) Int. Cl.
*A01M 1/02* (2006.01)
*G08B 13/26* (2006.01)
(Continued)

(52) U.S. Cl.
CPC ............. *A01M 1/026* (2013.01); *G01D 5/24* (2013.01); *G08B 13/26* (2013.01); *G08B 21/00* (2013.01);
(Continued)

(58) Field of Classification Search
CPC .................................................. A01M 1/026
See application file for complete search history.

(56) References Cited

U.S. PATENT DOCUMENTS

| 3,843,924 A | 10/1974 | Wahlgren |
| 5,392,732 A | 2/1995 | Fry |

(Continued)

FOREIGN PATENT DOCUMENTS

| AU | 2013/203436 | 5/2013 |
| WO | 2012/054990 | 5/2012 |

(Continued)

OTHER PUBLICATIONS

International Preliminary Report on Patentability and Written Opinion in International Application No. PCT/AU2017/051104 dated Apr. 16, 2019 (5 pages).

(Continued)

*Primary Examiner* — Travis R Hunnings
(74) *Attorney, Agent, or Firm* — Nixon & Vanderhye P.C.

(57) ABSTRACT

A method for detecting an arthropod, the method being performed using an apparatus including a detection surface, an electrode grid including electrodes arranged relative to the detection surface, and an electronic processing device, wherein the method includes, in the electronic processing device: measuring changes in electrical properties of the electrode grid in response to at least one of movement and positioning of one or more body parts of an arthropod in proximity to the detection surface; and, determining whether the arthropod is of a particular arthropod type by analysing the changes to determine whether the changes are indicative of a characteristic behaviour of the particular arthropod type.

20 Claims, 10 Drawing Sheets

(51) Int. Cl.
| | |
|---|---|
| H01J 1/02 | (2006.01) |
| G08B 21/00 | (2006.01) |
| G08B 21/18 | (2006.01) |
| G01D 5/24 | (2006.01) |
| G01R 27/26 | (2006.01) |
| G01V 3/08 | (2006.01) |

(52) U.S. Cl.
CPC .............. *G08B 21/18* (2013.01); *H01J 1/02* (2013.01); *A01M 2200/012* (2013.01); *G01R 27/2605* (2013.01); *G01V 3/088* (2013.01)

(56) References Cited

U.S. PATENT DOCUMENTS

| | | | |
|---|---|---|---|
| 6,134,826 | A | 10/2000 | Mah |
| 6,707,384 | B1 | 3/2004 | Shuman et al. |
| 6,914,529 | B2 | 7/2005 | Barber et al. |
| 6,937,156 | B2 | 8/2005 | Gardner, Jr. et al. |
| 7,212,112 | B2 | 5/2007 | Barber et al. |
| 7,262,702 | B2 | 8/2007 | Barber et al. |
| 7,509,770 | B2 | 3/2009 | Gardner, Jr. et al. |
| 2003/0184442 | A1* | 10/2003 | Gardner, Jr. ........ A01M 31/002 340/573.2 |
| 2003/0213161 | A1* | 11/2003 | Gardner, Jr. ........ A01M 31/002 43/114 |
| 2003/0218543 | A1* | 11/2003 | Gardner, Jr. ........ A01M 31/002 43/132.1 |
| 2009/0223115 | A1* | 9/2009 | Lang ...................... A01M 1/14 43/123 |
| 2015/0085100 | A1 | 3/2015 | Raschella et al. |
| 2015/0208636 | A1 | 7/2015 | David et al. |

FOREIGN PATENT DOCUMENTS

| | | |
|---|---|---|
| WO | 2015/160958 | 10/2015 |
| WO | 2016/073429 | 5/2016 |
| WO | 2017/208068 | 12/2017 |

OTHER PUBLICATIONS

Beerwinkle KR et al, "Instrumentation for measuring activity of mites and similar crawling inserts, in vitro", *The Southwestern, Entomologist*, vol. 6(1); Mar. 1981, pp. 65-69.

Campbell, JM et al, "Capacitance-based sensor for monitoring bees passing through a tunnel", *Measurement Science and Technology*, 2005, 16, pp. 2503-2510.

Chabora, PC, et al, "The automated recording of insect activity: the House Fly", *Annals of the Entomological Society of America*, vol. 72(2), 1979, pp. 287-290.

engel, JE, et al, "An optoelectronic sensor for monitoring small movements in insects", *Florida Entomologies*, 84(3), 2001, pp. 336-343.

Haskell, PT, "An automatic recording maze for insert behaviour studies" *The British Journal of Animal Behaviour*, 1954, pp. 153-158.

Itskov, P., et al, "Automated monitoring and quantitative analysis of feeding behaviour in *Drosophila*", *Nature Communications*, 2014, 4560(5), pp. 1-10.

Jackson, C., et al; "Direct monitoring of the electrostatic charge of house-flies (*Musca domestica* L.) as they walk on a dielectric surface", *Journal of Electrostatics*, 2005, 63, pp. 803-808.

Nishikawa, H., et al, "Attofarad-level capacitance variation detector users RF-sensor with 98/100 MHz oscillator/local superheterodyne scheme for wireless pest sensor", 2014.

Reynolds, DR, et al, "Remote-sensing, telemetric and computer-based technologies for investigating insect movement: a survey of existing and potential techniques", *Computers and Electronics in Agriculture*, 35, 2002, pp. 271-307.

Snowball, MF, et al, "An electronic device for monitoring escape behaviour in *Musca* and *Drosophila*", *Journal of Neuroscience Methods*, 51, 1994, pp. 91-94.

Stange, G. and Hardeland, R., "A recording method for locomotor activity of small insects" *Oecologia* (Berlin), 1970, 5: pp. 400-405.

International Search Report for PCT/AU2017/051104, dated Jan. 2, 2018, 5 pages.

Written Opinion of the ISA for PCT/AU2017/051104, dated Jan. 2, 2018, 4 pages.

Bonjour et al. "Probing Behavior Comparisons of Squash Bugs (Heteroptera: Coreidae) on Cucurbit Hosts" Environmental Entomology 20(1):143-149 (1991).

Devries et al. "Feel the Heat: Activation, Orientation and Feeding Responses of Bed Bugs to Targets at Different Temperatures" Journal of Experimental Biology 219:3773-3780 (2016).

Díaz-Fleischer et al. "Evolution of Fruit Fly Oviposition Behavior" ResearchGate, Fruit Flies (Tephritidae): Phylogeny and Evolution of Behavior, Chapter 30, CRC Press, pp. 811-841 (2000).

Duan et al. "Spring Behavioral Patterns of the Apple Blossom Weevil" Entomologia Experimentalis et Applicata 79:9-17 (1996).

James et al. Fauna and Seasonal Abundance of *Carpophilus* spp. (Coleoptera: Nitidulidae) in Four Stone Fruit Growing Regions of Southeastern Australia as Determined by Pheromone-trapping Journal of Australian Entomological Society 34:327-333 (1995).

Nadel et al. "Identity, Behavior, and Efficacy of Nitidulid Beetles (Coleoptera: Nitidulidae) Pollinating Commercial Annona Species in Florida" Environmental Entomologists 23(4):878-886 (1994).

Spradbery et al. "The Biology of *Pseudorhyssa stemata* Merrill (Hym., Ichneumonidae), a Cleptoparasite of Siricid Woodwasps" Bulletin of Entomological Research 59:291-297 (1968).

Stubbins et al. "Mouthpart Morphology and Feeding Behavior of the Invasive Kudzu Bug, *Megacopta cribraria* (Hemiptera: Plataspidae)" Invertebrate Biology 136(3):309-320 (2017).

Vijaysegaran et al. "Mouthpart Structure, Feeding Mechanisms, and Natural Food Sources of *Adult Bactrocera* (Diptera: Tephritidae)" Annuals of Entomological Society of America 90(2): 184-201 (1997).

Walker "Probing and Oviposition Behavior of the Bayberry Whitefly (Homoptera: Aleyrodidae) on Young and Mature Lemon Leaves" Annuals of Entomological Society of America 80:524-529 (1987).

Wölfling et al. "How Differences in the Settling Behaviour of Moths (Lepidoptera) May Contribute to Sampling Bias When Using Automated Light Traps" European Journal of Entomology 113:502-506 (2016).

* cited by examiner

ARTHROPOD DETECTION

This application is the U.S. national phase of International Application No. PCT/AU2017/051104 filed 12 Oct. 2017, which designated the U.S. and claims priority to AU Patent Application No. 2016904141 filed 12 Oct. 2016, the entire contents of each of which are hereby incorporated by reference.

BACKGROUND OF THE INVENTION

This invention relates to methods and apparatus for detecting arthropods, such as insects, being particularly adapted for detecting a particular arthropod type of interest.

DESCRIPTION OF THE PRIOR ART

Insect pests can cause significant damage to food and fibre production systems, and therefore detecting these pests is required in order to consider pest control options. Monitoring for the presence of insect pests is conducted by placing a monitoring device or detector, such as an insect trap of various sorts, in strategic locations throughout food and fibre production regions, ports of entry, transport routes and at borders of jurisdictions such as States, Territories, and Countries. Capacitive detectors have been proposed for capacitively sensing pests; however these are generally incapable of distinguishing between different types of arthropods.

WO2012054990A1 relates to a real-time insect monitoring device for the in-situ monitoring of insects, and in particular an insect inspection cylinder and trap to facilitate this monitoring. The trap comprises means to intercept flying insects and direct them to an inspection cylinder that is connected to an outlet from the means to intercept flying insects. An insect detector is associated with the cylinder to detect insects inside it, and a camera is associated with the cylinder and the detector to capture images of insects inside the cylinder. Wherein the sectional dimensions of the inspection cylinder are sized to prevent insects selected for observation from flying through it, but instead requiring them to walk through it.

U.S. Pat. No. 6,937,156B2 discloses a method and apparatus for capacitively sensing pests. The detector may be employed as either a passive detector and/or as a part of a combined detector and trap. The sensor system includes at least two sensor electrodes and a capacitance sensing circuit. When a non-capacitive object, such as a pest, approaches the sensor electrodes, the capacitance of the sensor electrodes increases due to the object having a higher dielectric constant than air. A capacitance sensing circuit detects the increased capacitance and provides an output signal that a pest has entered the area being monitored. The capacitance sensing circuit may also be constructed to measure the change in the electrode in order to determine the size and/or type of pest based on a characteristic change.

U.S. Pat. No. 7,509,770B2 discloses a method and apparatus for automatic pest trap report generation and additional trap parameter data. A reporting system collects, communicates and analyzes information from a plurality of pest monitoring locations. The monitored locations include activity sensing pest devices. These devices can include traps and/or passive and active monitoring devices not having a trapping or killing functionality. The system includes automatic reporting from the plurality of activity sensing pest devices and also includes physical inspection data. Preferably an automatic real-time communication system is used, with the preferred communication system being a radio-frequency (RF) or other over-the-air system. However, hardwired systems, use of a personal digital assistant (PDA) as an interim data carrier, and other technologies may also be employed. Manual input devices for providing the additional physical inspection data on the activity sensing pest device parameters and a computer based report generator (of the resulting combined data) provide for a robust and efficient pest monitoring and/or trapping tool.

The reference in this specification to any prior publication (or information derived from it), or to any matter which is known, is not, and should not be taken as an acknowledgment or admission or any form of suggestion that the prior publication (or information derived from it) or known matter forms part of the common general knowledge in the field of endeavour to which this specification relates.

SUMMARY OF THE PRESENT INVENTION

In a first broad form, an aspect of the present invention seeks to provide a method for detecting an arthropod, the method being performed using an apparatus including a detection surface, an electrode grid including electrodes arranged relative to the detection surface, and an electronic processing device, wherein the method includes, in the electronic processing device: measuring changes in electrical properties of the electrode grid in response to at least one of movement and positioning of one or more body parts of an arthropod in proximity to the detection surface; and, determining whether the arthropod is of a particular arthropod type by analysing the changes to determine whether the changes are indicative of a characteristic behaviour of the particular arthropod type.

In one embodiment at least some of the electrodes are capacitive electrodes and the changes include capacitance changes between one or more pairs of the capacitive electrodes.

In one embodiment the method includes measuring one or more capacitance signals including the capacitance changes.

In one embodiment the method includes measuring changes in a capacitance signal over time.

In one embodiment the capacitance changes include changes in one or more of: intensity of a capacitance signal; frequency of a capacitance signal; duration of a capacitance signal; type of a capacitance signal; a duration between subsequent events of a capacitance signal; and, a number of capacitance signals.

In one embodiment the method includes analysing the capacitance changes by comparing the capacitance signal to a signal pattern that is known to be indicative of the characteristic behaviour.

In one embodiment the characteristic behaviour includes a characteristic movement of a body part of the arthropod relative to the detection surface.

In one embodiment the characteristic behaviour includes at least one of: walking on the detection surface with tarsi of the arthropod; dragging on the detection surface with an abdomen of the arthropod; palping on the detection surface with a mouthpart of the arthropod; drumming on the detection surface with antennae of the arthropod; and, ovipositing on the detection surface with an ovipositor of the arthropod.

In one embodiment the method includes determining a position of the detected arthropod relative to the detection surface based on the changes.

In one embodiment the method includes determining an orientation of the detected arthropod relative to the detection surface based on the changes.

In one embodiment the apparatus includes a camera and the method includes triggering the camera in response to a successful determination that the arthropod is of the particular arthropod type.

In one embodiment the apparatus includes an opening defined in the detection surface and the electrode grid includes at least two perimeter electrodes arranged proximate to a perimeter of the opening, and wherein measuring changes in the electrical properties of the electrode grid includes measuring changes in electrical properties between the at least two perimeter electrodes in response to at least one of movement and positioning of one or more body parts of an arthropod in proximity to the opening.

In one embodiment the at least two perimeter electrodes includes at least one pair of capacitive electrodes arranged on opposing sides of the perimeter of the opening, and wherein the method includes measuring capacitance changes between the at least one pair of capacitive electrodes.

In one embodiment the characteristic behaviour includes a characteristic movement of a body part of the arthropod relative to the opening.

In one embodiment the characteristic behaviour includes at least one of: inserting one or more body parts of the arthropod into the opening; inserting an ovipositor of the arthropod into the opening; and, the entire arthropod moving through the opening.

In one embodiment the changes in electrical properties include changes in response to a material being deposited by the arthropod in proximity to the detection surface and wherein the method includes analysing the changes to determine whether the changes are indicative of a characteristic behaviour including depositing material.

In a second broad form, an aspect of the present invention seeks to provide an apparatus for detecting an arthropod, the apparatus including: a detection surface; an electrode grid including electrodes arranged relative to the detection surface; and, an electronic processing device configured to: measure changes in electrical properties of the electrode grid in response to at least one of movement and positioning of one or more body parts of an arthropod in proximity to the detection surface; and, determine whether the arthropod is of a particular arthropod type by analysing the changes to determine whether the changes are indicative of a characteristic behaviour of the particular arthropod type.

In one embodiment the electrode grid includes capacitive electrodes and the electronic processing device is configured to measure capacitance changes between one or more pairs of the capacitive electrodes.

In one embodiment the electrode grid is configured so that the capacitance changes occur in response to one or more body parts of the arthropod being positioned between the one or more pairs of the capacitive electrodes.

In one embodiment the electrode grid includes a first set of electrodes arranged in rows and a second set of electrodes arranged in columns.

In one embodiment the electrode grid is provided on a flexible printed circuit board.

In one embodiment the detection surface includes a surface that is at least one of: substantially planar; curved; cylindrical; frustoconical; and, spherical.

In one embodiment the detection surface includes a cylindrical detection surface defining a central hole and the electrode grid includes a pair of capacitive electrodes arranged on opposing sides of the hole In one embodiment the detection surface includes a combination of interconnected surfaces each including electrodes.

In one embodiment the detection surface is coated with a material selected to at least one of: attract the particular arthropod type; and, stimulate a characteristic behaviour of the particular arthropod type.

In one embodiment the detection surface is provided proximate to an entrance to a trap.

In one embodiment the apparatus includes a camera.

In one embodiment the electronic processing device is configured to trigger the camera in response to a successful determination that the detected arthropod is of the particular arthropod type.

In one embodiment the apparatus includes a sensor, the electronic processing device being further configured to trigger the sensor in response to a successful determination that the detected arthropod is of the particular arthropod type.

In one embodiment the apparatus includes a detection sensor for detecting the presence of the arthropod, the electronic processing device being configured to start measuring changes in electrical properties of the electrode grid in response to activation of the detection sensor.

In one embodiment the apparatus includes an actuator, the electronic processing device being further configured to trigger the actuator in response to a successful determination that the detected arthropod is of the particular arthropod type.

In one embodiment the electronic processing device is configured to generate a notification in response to a successful determination that the detected arthropod is of the particular arthropod type.

In one embodiment the electronic processing device includes a communications module for transmitting the notification to another electronic processing device.

In one embodiment the apparatus includes an opening defined in the detection surface and the electrode grid includes at least two perimeter electrodes arranged proximate to a perimeter of the opening, and wherein the electronic processing device is configured to measure changes in electrical properties between the at least two perimeter electrodes in response to at least one of movement and positioning of one or more body parts of an arthropod in proximity to the opening.

In one embodiment the at least two perimeter electrodes includes a pair of capacitive electrodes arranged on opposing sides of the perimeter of the opening.

In one embodiment the at least two perimeter electrodes includes a plurality of pairs of capacitive electrodes arranged about the perimeter of the opening.

In one embodiment the at least two perimeter electrodes are provided on a layer of a multi-layer printed circuit board.

In one embodiment the at least two perimeter electrodes include at least some electrodes provided on different layers of the multi-layer printed circuit board.

In one embodiment the apparatus includes conductors on other layers of the multi-layer printed circuit board for modifying the electrical properties between the at least two perimeter electrodes.

In one embodiment the opening has a shape selected from one of: a circle; a square; a rectangle; and, a slot.

In one embodiment the apparatus is configured to perform the method as described above.

In a third broad form, an aspect of the present invention seeks to provide a method for detecting an arthropod, the method being performed using an apparatus including a number of electrodes and an electronic processing device, wherein the method includes, in the electronic processing device: measuring changes in electrical properties of the electrodes in response to at least one of movement and positioning of one or more body parts of an arthropod in proximity to the electrodes; and, determining whether the arthropod is of a particular arthropod type by analysing the changes to determine whether the changes are indicative of a characteristic behaviour of the particular arthropod type.

In a fourth broad form, an aspect of the present invention seeks to provide an apparatus for detecting an arthropod, the apparatus including: a number of electrodes; and, an electronic processing device configured to: measure changes in electrical properties of the electrodes in response to at least one of movement and positioning of one or more body parts of an arthropod in proximity to the electrodes; and, determine whether the arthropod is of a particular arthropod type by analysing the changes to determine whether the changes are indicative of a characteristic behaviour of the particular arthropod type.

It will be appreciated that the broad forms of the invention and their respective features can be used in conjunction, interchangeably and/or independently, and reference to separate broad forms is not intended to be limiting.

BRIEF DESCRIPTION OF THE DRAWINGS

An example of the present invention will now be described with reference to the accompanying drawings, in which:—

DETAILED DESCRIPTION OF THE PREFERRED EMBODIMENTS

Figure 1:
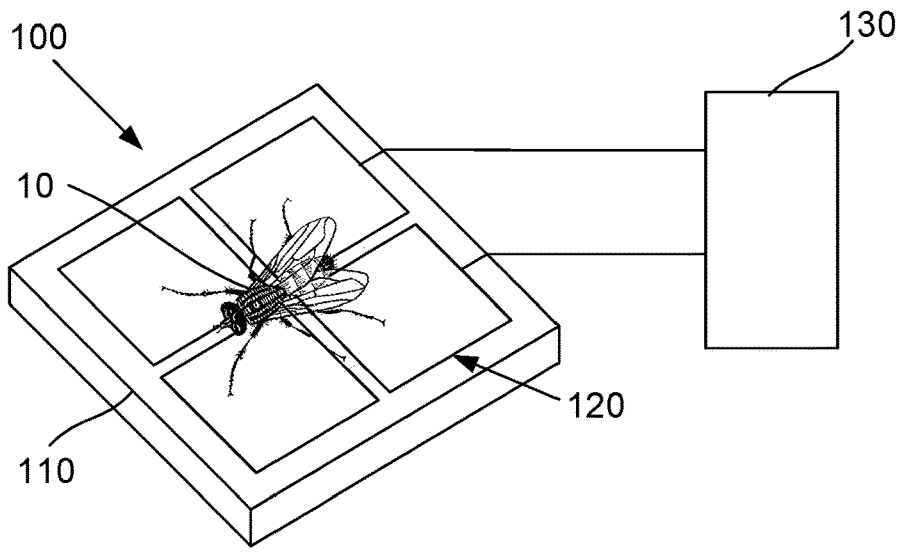
FIG. 1 is a schematic diagram of an example of an apparatus for detecting an arthropod.

An example of an apparatus 100 and a corresponding method of its use for detecting an arthropod 10 will now be described with reference to FIG. 1.

In broad terms, the apparatus 100 includes a detection surface 110, an electrode grid 120 including electrodes arranged relative to the detection surface 110, and an electronic processing device 130. The electronic processing device 130 is configured to measure changes in electrical properties of the electrode grid 120 in response to at least one of movement and positioning of one or more body parts of an arthropod 10 in proximity to the detection surface 110, and determine whether the arthropod 10 is of a particular arthropod type by analysing the changes to determine whether the changes are indicative of a characteristic behaviour of the particular arthropod type.

Figure 2:
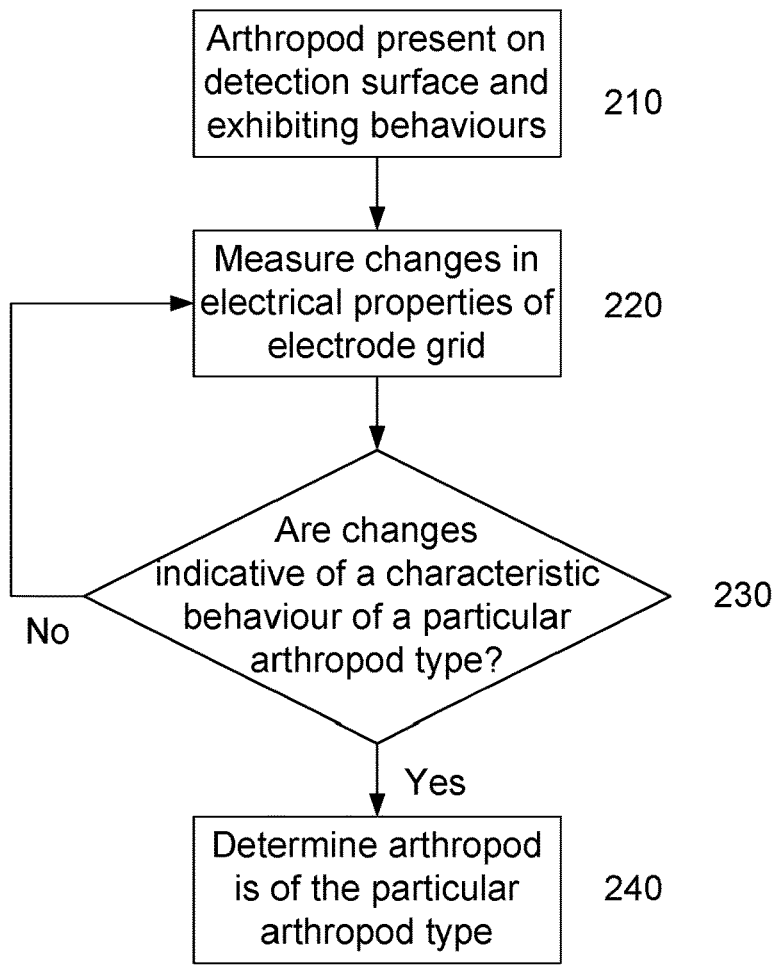
FIG. 2 is a flow chart of an example of a method for detecting an arthropod.

An example of a method for detecting an arthropod 10 using an apparatus 100 as described above is shown in FIG. 2. The method commences at step 210, when an arthropod 10 is present on the detection surface 110 and is exhibiting behaviours. Step 220 involves the electronic processing device 130 measuring changes in electrical properties of the electrode grid 120 in response to the movement and/or the positioning of one or more body parts of the arthropod 10 in proximity to the detection surface. At step 230, the electronic processing device 130 will analyse the measured changes to determine whether these are indicative of a characteristic behaviour of a particular arthropod type. Upon a successful determination that the changes were indicative of a characteristic behaviour of that particular arthropod type at step 230, the electronic processing device 130 determines that the arthropod 10 is of the particular arthropod type at step 240. However, in the event the changes are not determined to be indicative of a characteristic behaviour, the electronic processing device 130 may continue measuring changes in electrical properties of the electrode grid 120 at step 220.

It will be appreciated that an arthropod 10 is an invertebrate animal typically having an exoskeleton, a segmented body, and jointed appendages. Arthropods include insects (such as flies, mosquitoes, moths, wasps, bees, ants, cockroaches, beetles, grasshoppers or the like), arachnids (such as spiders, scorpions or the like), myriapods (such as centipedes, millipedes or the like), and crustaceans. It should be noted that the examples of arthropods listed here and mentioned throughout this specification are not intended to provide an exhaustive definition of arthropods.

In broad terms, behaviours of an arthropod may involve an action or series of actions involving the movement of one or more body parts and/or the positioning of one or more body parts of the arthropod. It will be appreciated that different arthropod types may have different behaviours that can be used to discriminate between arthropod taxa, groups, and sexes. When an arthropod is present on the detection surface 110 and exhibiting behaviours, the electrical properties of the electrode grid 120 will change in accordance with movements or positions of the body parts of the arthropod as a result of the arthropod behaviour. These changes may include specific characteristics that can be reliably associated with characteristic behaviours of different arthropods to allow arthropod types to be distinguished from one another solely based on the changes.

For example, flies with spongy mouthparts may display a characteristic behaviour of palping surfaces (also referred to as palpation), which may be indicated in changes in the electrical properties of the electrode grid 120 to thereby allow that particular arthropod type to be distinguished from other arthropods as discussed above. Palping behaviour involves the fly bringing its spongy mouthparts into contact with a surface to effectively 'taste' the contacted part of the surface. Palping contact with the detection surface 110 can result in significant changes in electrical properties of the electrode grid 120 which may be readily distinguished from changes due to the tarsi of arthropods walking across the detection surface 110. Accordingly, the processing device 130 may be configured to identify changes indicative of such palping behaviour to thereby determine when a fly with spongy mouthparts is on the detection surface 110. Other examples of characteristic behaviours that may be used by the apparatus will be discussed in due course.

It will be appreciated that different changes in electrical properties may be measured by the processing system, depending on the particular configuration of the electrode grid and the types of changes that may be generated by the different characteristic behaviours of arthropod types of interest.

In some embodiments, at least some of the electrodes of the electrode grid 120 may be provided in the form of capacitive electrodes, such that the changes in electrical properties may include capacitance changes between one or more pairs of the capacitive electrodes. Accordingly, the apparatus may be used to detect the presence of a particular arthropod type of interest based on a change in capacitance that may occur when an arthropod places a body part in a physical space between two electrodes. It will be appreciated that known capacitive sensing techniques may be utilised in this regard, such that those skilled in the art will be capable of selecting suitable capacitive electrodes for the purpose of the functionalities described herein.

Returning to the example of identifying palping behaviour of flies with spongy mouthparts, if palpation occurs on a capacitive electrode or in the physical space between two capacitive electrodes, a strong capacitive coupling between those capacitive electrodes may occur, resulting in a significant change in capacitance between the electrodes. The change in capacitance due to the palpation could be substantially greater than the change in capacitance due to arthropod proximity, or placement of tarsi. This difference can be exploited in order to discriminate between arthropods that palpate (e.g., some types of flies) and those that do not.

In some implementations, the apparatus 100 may be used to measure one or more capacitance signals including the capacitance changes. A single capacitance signal may be measured for a pair of capacitive electrodes, although multiple capacitance signals may be measured in an electrode grid 120 having a plurality of electrodes. For instance, a capacitance signal may be measured for each of a plurality of pairs of capacitive electrodes in the electrode grid 120. The capacitance signal may be processed to identify capacitance changes that can be associated with characteristic behaviours of particular arthropod types.

The capacitance changes in the capacitance signals may vary in different ways depending on the body part and the behaviour of the arthropod. For example, the capacitance changes may include changes in an intensity of a capacitance signal, a frequency of a capacitance signal, a duration of a capacitance signal, type of a capacitance signal or a number of capacitance signals, or any combination thereof. The capacitance changes may relate to changes in the capacitance signals over time. For instance, the intensity or spectral (frequency) content of a capacitance signal may be changing over time, or the capacitance signal may include events such as pulses or waves or steps, where these events may be separated by various durations or spacings. In some examples, the capacitance changes measured in the method may include a duration between subsequent events of a capacitance signal. In other examples, the capacitance signal may include a step change of a capacitance signal, such as when a flying arthropod lands on the detection surface. In any event, this variability may be exploited to discriminate between arthropod taxa, groups, and sexes.

For example, in some embodiments, the capacitance changes may be analysed by comparing the capacitance signal to a signal pattern that is known to be indicative of the characteristic behaviour. When such a known signal pattern is found to be present in the capacitance signal, this will be indicative of the presence of an arthropod associated with the characteristic behaviour on the detection surface 110.

Figure 7:
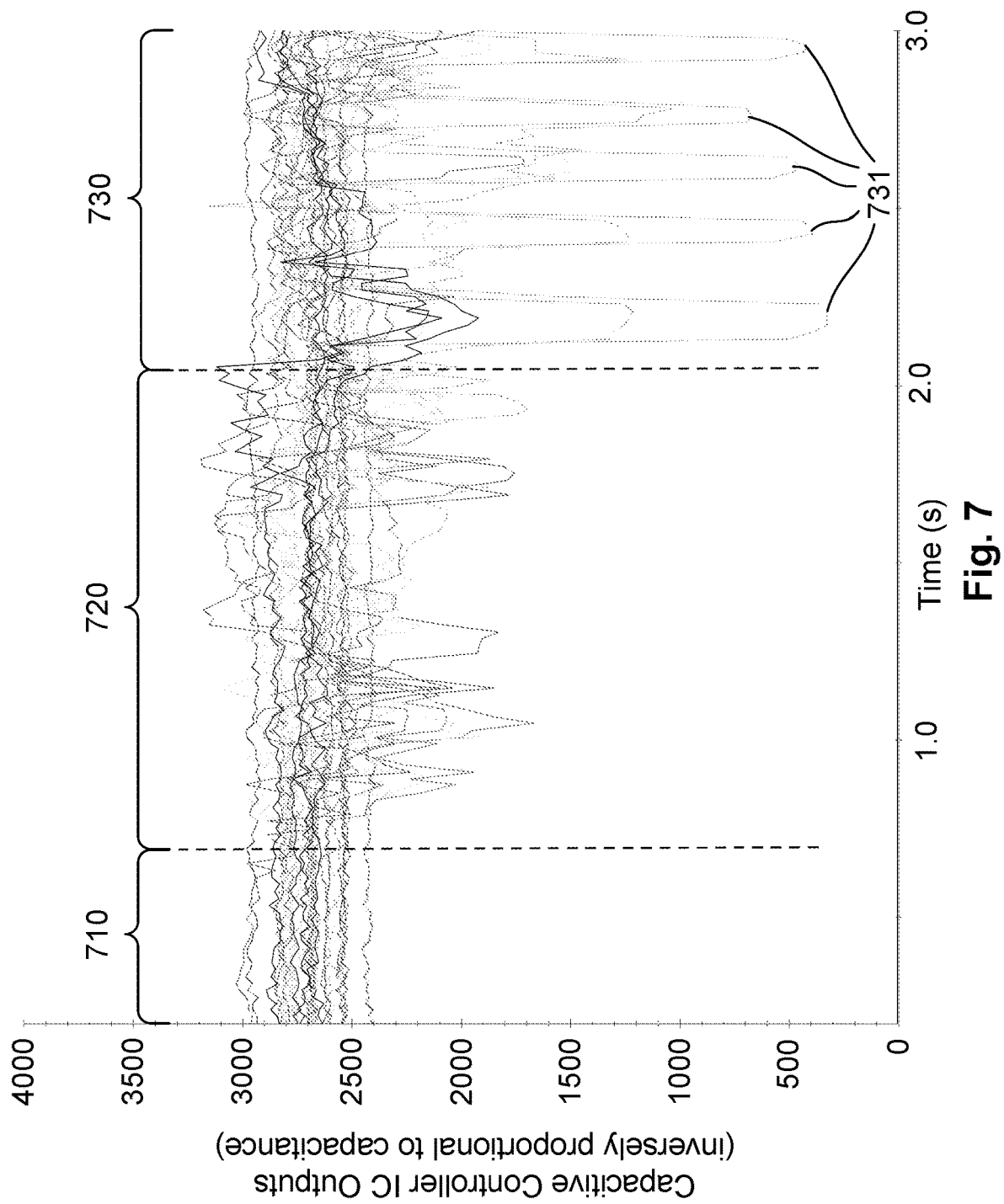
FIG. 7 is a plot of measured changes in electrical properties in response to a behaviour of an arthropod on a detection surface of an embodiment of the apparatus.

FIG. 7 shows a plot representing capacitance signals measured from multiple pairs of capacitive electrodes of an embodiment of the apparatus 100. The plot is a time series where the x-axis relates to time and the y-axis relates to an electrical measurement that is inversely proportional to capacitance. Each line in the plot represents data from a different electrode pair. The values are "counts" produced by a capacitive controller that is provided as part of the electronic processing device. The "counts" are inversely proportional to the capacitance between the electrodes. The plot shows the capacitive signals that are produced when there is no arthropod present, when a fruit fly is present, and when the fruit fly palps.

A first time period 710 corresponds to baseline capacitance signals when no arthropod is present. In a second time period 720, a fruit fly is present and moving across the detection surface 110, and changes in a number of the capacitance signals can be seen, which correspond to tarsi and other parts of the fruit fly causing capacitive coupling between some of the electrode pairs as the fruit fly moves across the detection surface 110. Finally, a third time period 730 includes corresponds to a period of time in which the fruit fly was exhibiting palping behaviour on the detection surface, in which the fruit fly periodically contacted the detection surface 110 with its mouthpart. The palping resulted in significant capacitive changes 731 that can be readily distinguished from those seen in the second time period 720 due to movement of the fruit fly without any palping.

Accordingly, it will be appreciated that the electronic processing device 130 may be configured to analyse capacitance signals for capacitive changes having similar characteristics in terms of relative intensity, period and the like to therefore determine whether these correlate to the characteristic behaviour of palping for a fruit fly, to thereby allow the presence of a fruit fly to be detected using the apparatus 100.

In some examples, the electronic processing device 130 may be configured to analyse capacitance signals that are measured simultaneously from a plurality of electrodes, in order to identify a relative change in capacitance across multiple electrode pairs that is unique to an arthropod type.

For example, for an arthropod at rest on the detection surface—each tarsus may produce a capacitance change for a corresponding electrode pair that may not necessarily be unique in isolation, but it may be possible to analyse the physical locations of all electrode pairs where a capacitance change is occurring to determine a multi-channel capacitance change signal that may be indicative of a characteristic behaviour. For example, the relative positions of the electrode pairs undergoing capacitance changes corresponding to tarsi may be analysed to determine a "footprint" of the arthropod that may be unique to a species or group of species.

In another example, an arthropod with a very large abdomen (for instance, large enough to span multiple electrode pairs) may have a characteristic behaviour which involves dragging the abdomen across the detection surface. Accordingly, if a large change in capacitance is observed across multiple adjacent electrode pairs, this could be indicative of the characteristic behaviour, hence specific arthropod taxa.

In some examples, the electronic processing device 130 may be configured to analyse a time relationship between capacitance changes on different electrode pairs, such as due to the sequence of movements and placements of tarsi when an arthropod is walking or running.

Whilst capacitance changes have been discussed above as an example of changes in electrical properties of the electrode grid that may be measured and analysed to determine whether the arthropod is of a particular arthropod type, it should be understood that other types of changes may be utilised, subject to suitable configuration of the apparatus 100. For instance, in some examples, changes in the impedance between two electrodes may be measured and analysed using similar principles as discussed above.

In general terms, the characteristic behaviour may include any characteristic movement or positioning of one or more body parts of the arthropod relative to the detection surface 100. Some specific examples of characteristic behaviours involving movements of body parts that may allow different arthropod devices to be distinguished may include palping on the detection surface with a mouthpart of the arthropod as mentioned above, along with walking on the detection surface with tarsi of the arthropod, dragging on the detection surface with an abdomen of the arthropod, drumming on the detection surface with antennae of the arthropod and ovipositing on the detection surface with an ovipositor of the arthropod. On the other hand, some examples of characteristic behaviours involving positioning of body parts may include resting behaviours that may be uniquely associated with a particular arthropod type. It should be appreciated that the above examples are not intended to provide an exhaustive list of possible characteristic behaviours, and other unique behaviours of arthropods may be used.

Whilst the palping behaviour of fruit flies has been specifically discussed, it will be appreciated that other arthropod types will have their own unique characteristic behaviours which can be identified using the apparatus. For example, wasps and bees have a characteristic behaviour of drumming on surfaces with their antennae which can generate changes in electrical properties that may be distinguished from those generated by other types of arthropods walking on the detection surface 110 in a similar manner as discussed above for palping. In other examples, some arthropods may exhibit characteristic resting behaviours. For instance, a mosquito may land on the detection surface 110, not move while landed, and then fly away again. In contrast, a lady beetle may wander onto the middle of the detection surface 110, rest for a period of time (this may or may not involve other movements such as lowering its body closer to the detection surface while resting), then continue walking.

In any case, it will be appreciated that specific analysis algorithms may be defined for identifying different types of characteristic behaviours.

It should be appreciated that movement of an arthropod's body parts may be different to overall movement of an arthropod. For instance, an arthropod may be resting in a single position in the middle of the detection surface 110, but might still be drumming its antennae on a specific region of the detection surface 110.

It should also be appreciated that not all arthropod behaviours will necessarily constitute characteristic behaviours for the purpose of determining whether a detected arthropod is of a particular type. For example, whilst some behaviours may produce changes in capacitance that are unique/characteristic of a particular arthropod species, many behaviours may not produce a unique/characteristic change in capacitance, but will still be detectable by the electrode grid 120.

Examples of characteristic behaviours of arthropods which may allow particular arthropod types to be distinguished from other arthropod types will now be discussed.

A range of different arthropod types have been shown to exhibit unique feeding behaviours, which may involve probing, dabbing or piercing movements of body parts.

Many species of fruit flies (Tephritids: *Diptera*) are known to probe and regurgitate on the surface they are walking as part of their feeding behaviour. Work by Vijaysegaran et al. (Vijaysegaran S, Walter G H, and Drew R A I. 1997. Mouthpart structure, feeding mechanisms, and natural food sources of adult *Bactrocera* (*Diptera*: Tephretidae). Annuals of Entomological Society of America 90(2): 184-201) shows the mouthpart structure, feeding mechanisms, and food sources of 4 species of fruit flies—*Bactrocera tryoni, B. jarvisi, B. cacuminata*, and *B. cucumis*. Recordings were made of feeding behaviour of flies looking at the movements of the mouthparts. It shows the mouth part (labellar) movement of flies as they feed.

Many species of plant bugs (Hemiptera) are known to probe, pierce and regurgitate or salivate as part of their feeding behaviour. Megacopta *cribraria* (phytophagous kudzu bug) has been shown to 'probe' or 'dab' a surface while they assess the suitability to pierce the surface and begin feeding (Stubbins F L, Mitchel P L, Turnbull M W. 2017. Mouthpart morphology and feeding behaviour of the invasive kudzu bug, Megacopta *cribraria* (Hemiptera: Plataspidae). Invertebrate biology 136:309-320).

The squash bug, *Anasa tristis*, probes then inserts its proboscis (Bonjour E L, Fargo W S, Webster J A, Richardson P E, and Brusewitz H. 1991. Probing behaviour comparisons of squash bugs (Heteroptera: Coreidae) on Cucurbit hosts. Environmental Entomology 20: 143-149).

Whiteflies, *Parabemisia myricae*, have been shown to probe on cut pieces of leaf; body held still, rostrum held approximately perpendicular to the leaf; apex of rostrum contacting leaf (Walker G P. 1987. Probing and oviposition behaviour of the Bayberry Whitefly (Homoptera: Aleyrodidae) on young and mature lemon leaves. Annuals of Entomological Society of America 80:524-529).

Bed bugs, *Cimex Lectularius*, has been shown to probe prior to feeding (an obligatory step), and that heat increases the rate of probing—either artificial heat or a warm blooded host (DeVries Z C, Mick R, and Schal C. 2016. Feel the heat: activation, orientation and feeding responses of bed bugs to targets at different temperatures. Journal of Experimental Biology 219:3773-3780).

Some arthropod types have been shown to exhibit unique boring behaviour. Several species of Nitidulids are known to enter dark spaces, such as newly opening flowers (the start of anthesis) and bore into ripening fruit (Nadel H, and Pena J E. 1994. Identity, behaviour and efficacy of Nitidulid Beetles (Coleoptera: Nitidulaidae) pollinating commercial Annona species in Florida. Environmental Entomologists 23:94): 878-886; and James D G, Faulder R J, Bartelt R J. 1995. Fauna and seasonal abundance of Carpohilus spp. (Coleoptera: Nitidulidae) in four stone fruit growing regions of southeastern Australia as determined by pheromone-trapping. Journal of Australian Entomological Society 34:327-333). The apple blossom weevil, *Anthonomus pomorum* crawls under loose apple bark (Duan J J, Weber D C, Hirs B, and Dorn S. 1996. Spring behavioural patterns of the apple blossom weevil. Entomologia Experimentalis et Applicata 79:9-17).

Host-marking behaviour prior to ovipositing is common in many insects. This usually involves dragging the aculeus (pointy part of an insect's ovipositor) about the surface of an object, host fruit, other plant part, resulting in deposition of a substance (Diaz-Fleishcer F, Papaj D R, Prokopy R J, Norrbom A L, and Aluja M. 2001. Evolution of fruit fly oviposition behaviour. Chapter 30. In: Fruit Flies (Tehphritidae): Phylogeny and Evolution of Behaviour. CRC Press. Pp 811-841).

Many species of insects also use pre-existing holes and spaces to lay an egg. They will place their ovipositor in the hole and probe and often deposit an egg. For example, the parasite of wood wasp, *Pseudorhyssa sternata* will find an existing oviposition shaft and insert its ovipositor (Spradbery J P. 1968. The biology of *Pseudorhyssa sternata* Merril (Hym. Ichneumonidae), a cleptoparasite of Siricid wood-wasps. Bulletin of Entomological Research 59:291-297). Tephritid fruit flies often use existing oviposition punctures established by other flies, and in some species oviposition site reuse is obligatory (Diaz-Fleischer et al 2001).

Different species of moth have different settling behaviour once they arrive at a light. Some of the smaller species settle immediately, whereas some of the medium to large species have quite erratic behaviour at the light and they move back and forth quickly (Wolfling M, Becker M C, Uhl B, Traub A, and Fielder K. 2016. How difference in the settling behaviour of moths (Lepidopteran) may contribute to sampling bias when using automated light traps. European Journal of Entomology 113: 502-516).

It should be understood that the techniques disclosed herein are not intended to be limited to the above exemplified arthropod behaviours and it will be appreciated that the techniques may be adapted to distinguish a particular arthropod type from other arthropod types using any characteristic behaviours that may result in suitable distinctive changes in electrical properties of the electrodes.

In some implementations, characteristic behaviours for a particular arthropod type may only be indicated by capacitance changes over time due to a unique sequence or combination of behaviours (e.g. walk, rest, walk), rather than a single behaviour in isolation.

In some implementations, the apparatus 100 may also be used to determine a position and/or an orientation of the detected arthropod relative to the detection surface 110 based on the changes. For example, the electrode grid 120 may include a plurality of capacitive electrode pair in a predetermined layout so that capacitance signals from each pair can be mapped to the position of each electrode pair relative to the detection surface 110.

When an arthropod moves across the detection surface 110, capacitance signals may be measured from electrode pairs corresponding to the position of different parts of the arthropod such as tarsi, a mouthpart, an ovipositor, antennae, an abdomen or the like. The position of the arthropod can then be determined based on the particular electrode pairs have capacitance signals indicative of arthropod parts. For example, if a number of capacitance signals indicative of tarsi of an arthropod are measured from electrode pairs located in a particular region of the detection surface 110, but no capacitance signals are measured in other regions, it can be deduced that the arthropod is in the region that was the source of the capacitance signals.

This principle may be extended to allow the orientation of the arthropod to be determined. For instance, the different capacitance signals may be analysed to determine which particular arthropod parts are positioned in proximity to specific electrode pairs, which can allow relative positioning of the arthropod parts to be determined. The arthropod type may already be determined based on characteristic behaviour as discussed above, and the relative positioning from the measured capacitance signals may be compared against a model of typical relative positioning of arthropod parts for that particular arthropod type, which can allow the orientation to be determined.

Alternatively, the orientation of the arthropod may be predicted based on a movement direction of the arthropod. For example, as the arthropod moves across the detection surface 110, capacitance signals indicative of tarsi or other arthropod parts will be measured across progressively different pairs of the capacitive electrodes in different positions on the detection surface 110. The movement direction of the arthropod may thus be resolved based on changes in the positions of the electrode pairs from which capacitance signals are measured. In turn, the orientation of the arthropod may be implied based on known correlations between the movement direction and the orientation. For instance, if the particular arthropod type typically only engages in forward movement across surfaces, the orientation of the arthropod will be aligned with the movement direction.

In any event, it will be appreciated that the apparatus 100 may be used in a method for detecting the presence, position and/or orientation of a particular arthropod of interest on the detection surface 110 based on the measured changes in electrical properties of the electrode grid 120. Changes indicative of specific characteristic behaviours can be used to differentiate between different arthropod types to allow the apparatus to determine whether particular arthropods of interest are present, which can be particularly valuable in the monitoring for pest arthropods or the like.

The apparatus 100 and methods of its use may be particularly beneficial for detecting pest arthropods, although it should be understood that the apparatus 100 and associated methods may also be used to detect non-pest arthropods, including beneficial arthropods such as predators and pollinators. In essence, the apparatus 100 may be used for detecting any arthropod type of interest, provided a suitable characteristic behaviour can be identified for distinguishing that arthropod type.

The particular configuration of the electronic processing device 130 may depend to some extent on the form of the electrode grid 120 being used and the resulting form of the changes in the electrical properties that will be measured and analysed the processing device 130. For instance, in the example in which the electrode grid 120 includes capacitive electrodes, the processing device 130 may be configured to measure and analyse capacitance signals as described above. In some implementations, the electronic processing device 130 may include a capacitive controller unit for controlling the operation of the capacitive electrodes and measuring the capacitance signals therefrom, and a separate analysis processor for receiving the measured capacitance signals or an indication thereof, and performing the analysis of the capacitive changes to determine whether the changes are indicative of a characteristic behaviour of the particular arthropod type as discussed above.

Accordingly, the nature of the electronic processing device 130 and its functionality will vary depending on particular requirements of the apparatus 100. In one particular example, the electronic processing device 130 may include at least one processor, a memory, an optional input/output device, such as a keyboard and/or display, and a measurement interface for allowing changes in electrical properties of the electrode grid to be measured. In use, the processor may execute instructions in the form of applications software stored in the memory to perform required processes, such as analysing the changes to determine whether the changes are indicative of a characteristic behaviour of the particular arthropod type. Thus, actions performed by the processing device 130 may be performed by the processor in accordance with instructions stored as applications software in the memory and/or input commands received via the input/output device. The applications software may include one or more software modules, and may be executed in a suitable execution environment, such as an operating system environment, or the like.

Accordingly, it will be appreciated that the processing device 130 may be formed from any suitable processing system, such as a suitably programmed computer system, PC, lap-top, hand-held PC, server, or the like. In one particular example, the processing device is a standard processing system such as an Intel or AMD Architecture based processing system, which executes software applications stored on non-volatile (e.g., hard disk) storage, although this is not essential. However, it will also be understood that the processing device 130 could be or could include any electronic processing device such as a microprocessor, microchip processor, logic gate configuration, firmware optionally associated with implementing logic such as an FPGA (Field Programmable Gate Array), or any other electronic device, system or arrangement.

In some embodiments, the processing device 130 may be provided as part of an embedded processing system that is provided as an integral component of the apparatus 100. In any event, it may be desirable to design the processing device 130 for low power utilisation, especially for pest monitoring applications in remote locations without convenient access to mains electricity, since prolonged periods of battery-powered operation of the processing device 130 may be required.

The electrode grid 120 may include a plurality of distinct electrodes provided in a regular pattern arrangement, with each electrode being spaced apart from other adjacent electrodes. The electrode grid 120 may include separate transmit and receive electrodes interspersed in the pattern arrangement. In examples using capacitive electrodes, a voltage may be applied to the transmit electrodes whilst the receive electrodes may be grounded (or an opposing voltage may be applied) to thereby establish electric fields between pairs of adjacent transmit and receive electrodes. When an arthropod moves across the detection surface 110, whether on individual electrodes or through the physical spaces between the adjacent pairs of transmit and receive electrodes, this will cause a change in capacitive coupling between the adjacent pairs which can be detected by measuring the electrical properties of the electrodes. In some cases, transmit electrodes may be paired with more than one receive electrode.

It is theorised that the changes in capacitive coupling may be due to two effects: firstly the placement of the arthropod and its body parts in proximity of the electrodes (within the electric field between receive/transmit electrodes) changes the dielectric properties of the medium between the electrodes; secondly contact of arthropod parts on top of a receive or transmit electrode (such as due to palpation) causes the arthropod to become closely capacitively coupled to the electrode itself—such that the arthropod may effectively act as a physical extension of the electrode.

In some embodiments, the electrode grid 120 may include a first set of electrodes arranged in rows and a second set of electrodes arranged in columns. The first set of electrodes may be transmit electrodes and the second set of electrodes may be receive electrodes, or vice versa. In any event, such an arrangement of electrodes may facilitate measuring the electrical properties of the electrode rows and columns to detect changes, such as mutual capacitive coupling between the row and column electrodes, which can allow the locations of any capacitively coupled electrode pairs to be resolved using known capacitive sensing techniques. As the arthropod moves between the electrode pairs formed by the rows and columns, the changes can be measured and used to determine whether the arthropod is of a particular arthropod type as described above.

The geometry of the arrangement of the electrodes in the electrode grid 120 may be designed to give optimal performance for a desired arthropod detection task. For example, the geometry may be optimised in terms of selection of the space between adjacent electrode pairs, and the relative positioning of the electrode pairs. The electrode grid 120 may include electrodes having square, diamond, rectangular or line shapes, for instance.

The detection surface 110 may be provided as a simple two dimensional surface, although in some embodiments the detection surface 110 may be provided as the surface of a three-dimensional shape. The detection surface 110 may thus include a surface that is substantially planar, curved, cylindrical, frustoconical, or spherical. It should be appreciated that this list of surface shapes is not intended to be exhaustive. In some embodiments the detection surface 110 may include a combination of interconnected surfaces each including electrodes. This may allow the apparatus to respond differently to detections of arthropods on different surfaces. To allow embodiments having a non-planar detection surface 110, the electrode grid 120 may be provided on a flexible printed circuit board. In some other embodiments, an opening may be defined in the detection surface 110 and at least some electrodes of the electrode grid may be arranged about the opening. This may allow the apparatus to detect characteristic behaviours involving interactions with the opening, which may be exhibited by some arthropod types.

In some examples, the apparatus 100 may be specifically designed to detect one particular arthropod type only, and may include adaptations for attracting the particular arthropod type or stimulating a characteristic behaviour of the particular arthropod type.

For example, this may be achieved by coating the detection surface 120 with a material that has known attractant or behaviour stimulant qualities for the targeted arthropod type. For instance, the detection surface 120 may be coated with a material having a particular colour or other non-visible radiation response characteristics. Alternatively or additionally, the material may include a chemical or biological attractant, such as an odour that is known to attract the targeted arthropod type. Specific chemical or biological qualities of the material may also stimulate particular characteristic behaviours such as palping. For instance, fruit flies may be triggered to perform ovipositing behaviour on materials with waxy surface qualities. A surface texture of the material may also stimulate particular characteristic behaviours. For example, a specific surface roughness may stimulate particular behaviour in certain arthropod types.

The coating material could be any suitable material and may be applied in any suitable manner, such as by painting, spraying or applying a layer of gel or sheet material. In any event, it will be appreciated that such adaptations can allow for further targeting of a particular arthropod type for detection by the apparatus 100.

Typically, the coating material will be non-conductive so as to not interfere with the electrical operation of the electrode grid 120, however in some applications it may be desirable to use a conductive layer separated from the electrodes by an insulator layer. For example, such an arrangement may be used to detect an arthropod ovipositing by using a wafer-thin conductive layer that would be punctured by the arthropod's ovipositor.

Despite the above, it should be understood that a coating is not essential and in some alternative embodiments the detection surface may include exposed electrodes.

The apparatus 100 could operate in a stand-alone mode where arthropods are attracted to the sensing surface without being trapped, such as by using material coatings as discussed above.

However, in some embodiments, the detection surface 110 may be provided before or in an entrance to a trap. For instance, the detection surface 110 (and electrode grid 120 arranged thereon) may be provided in a suitable form for installation in the entrance of a commercially available insect trap. The electronic processing device 130 and any other apparatus 100 elements may be integrated with the detection surface or otherwise positioned outside of the trap and electrically connected to the electrode grid 120 using suitable wiring. By allowing the apparatus 100 to be retrofitted to a commercially available trap, the above described arthropod detection functionality can be provided to existing arthropod monitoring infrastructure. This can avoid the need for regular manual inspections of traps to monitor for the presence of arthropods, which can be particularly advantages in remote and widespread monitoring areas. Alternatively, the apparatus 100 may be integrated into a purpose designed trap.

In some examples, the apparatus 100 may further include a camera. This may be triggered by the electronic processing device 130 in response to a successful determination that the arthropod is of the particular arthropod type. The camera may thus capture an image each time an example of a targeted arthropod type is detected on the detection surface 110. This can be useful for allowing verification of the detection. Furthermore, by only triggering the camera when the particular arthropod type is detected, this can avoid unnecessarily capturing images of non-targeted arthropod types which might otherwise be the case if the camera was only triggered upon detection of an arthropod without determining the arthropod type based on characteristic behaviour. It will be appreciated that this can be advantageous from an energy efficiency perspective.

It will be appreciated that the apparatus 100 may include any sensor that may be triggered by detection of an arthropod of a targeted type. A camera as described above is one particularly advantageous example, although other forms of sensors such as an acoustic sensor, or a hyperspectral sensor may be used to beneficial effect.

In some examples, the apparatus 100 may include a detection sensor for detecting the presence of the arthropod. The detection sensor may be any type of sensor capable of initially detecting the presence of an arthropod, such as by detecting sound, motion or the like. The electronic processing device may be configured to only start measuring changes in capacitance or other electrical properties of the electrode grid in response to activation of the detection sensor.

Furthermore, it will be appreciated that the apparatus 100 may also be adapted to trigger an actuator or any other device that may be usefully operated in response to detection of an arthropod. For example, the apparatus 100 may be configured to trigger an actuator or device for causing a detected arthropod of a targeted arthropod type to be killed or captured, whilst allowing any arthropods of other types to be released.

In some embodiments, the electronic processing device 130 may be configured to generate a notification in response to a successful determination that the detected arthropod is of the particular arthropod type. It will be appreciated that the notification can be used to alert a user whenever the particular arthropod type is detected. The electronic processing device 130 may further include a communications module for transmitting the notification to another electronic processing device, such as a computer or smart phone of the user. Accordingly, a remote user may be alerted to the presence of the particular arthropod type to thereby allow monitoring in near real-time. It will be appreciated that multiple apparatus 100 may be provided across a monitoring area and configured to transmit notifications to a single other electronic processing, to enable a single user to monitor the entire area for the presence of the particular arthropod type, in near real-time.

The above mentioned camera functionality may also be incorporated with the notification functionality so that an image of the detected arthropod may be transmitted to the user to allow near real-time verification.

It will be appreciated that the techniques described above allow actions such as notifications and/or image capture by camera to be performed only for targeted arthropod types, whilst effectively filtering out the presence of other arthropod types that are not of interest. This can substantially avoid the need for users to manually monitor all detected arthropods as in conventional monitoring techniques, and therefore allow considerable more efficient monitoring for pest arthropods such as fruit flies and the like.

Further details of examples of specific embodiments of the apparatus for detecting arthropods will now be described.

Figure 3:
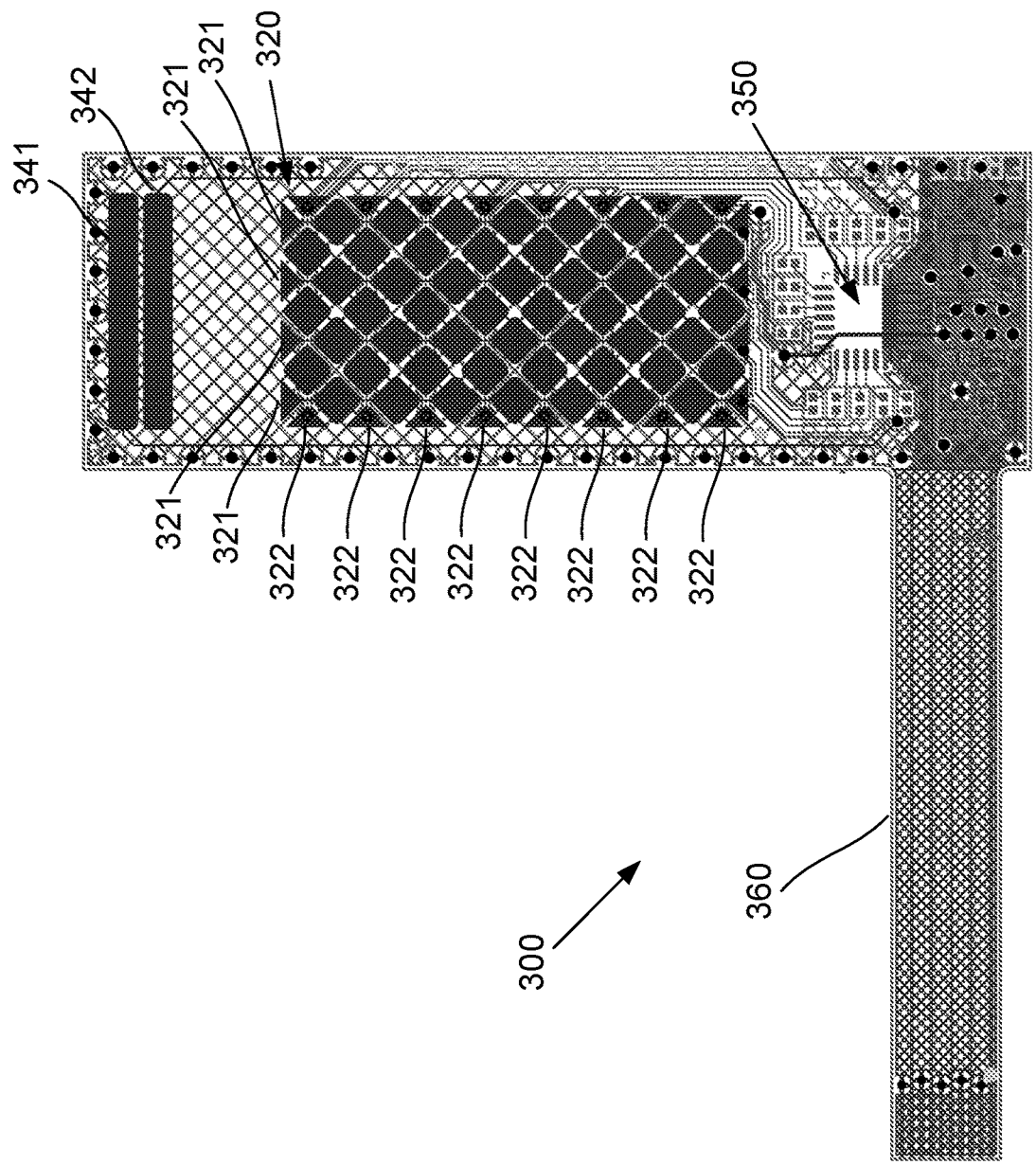
FIG. 3 is a plan view of an example of a printed circuit board including an electrode grid of an embodiment of the apparatus.

FIG. 3 is an example of a printed circuit board 300 for use in the apparatus, which includes an electrode grid 320 of diamond-shaped capacitive electrodes 321, 322. These electrodes include transmit electrodes 321 arranged in four columns and receive electrodes 322 arranged in eight rows. Adjacent transmit and receive electrodes 321, 322 form pairs for the purpose of measuring capacitive signals. A capacitive controller integrated circuit 350 may be provided for controlling the capacitive electrodes and measuring capacitive signals therefrom. A multi-channel connector 360 extends from the printed circuit board 300 to transfer the capacitive signals to a microprocessor or the like for analysis. It is noted that the capacitive signals may be converted into a different format prior to being transferred to the microprocessor. For example, the capacitive signals may be digitized or transformed using known signal processing techniques before receipt by the microprocessor. The connector 360 may also be used to carry electronic signals in the other direction, such as control signals from the microprocessor for configuring the capacitive controller integrated circuit 350.

In this example, there is also a separate rectangular-shaped transmit-receive electrode pair 341, 342 provided near an edge of the printed circuit board 300. In a practical application this rectangular pair 341, 342 would be located at the entrance of a trap or detection device. Only this single transmit-receive electrode pair 341, 342 would be active normally, thereby reducing power consumption. Operation of the full electrode grid 320 would be triggered by an arthropod detection on the rectangular electrode pair 341, 342.

It should be appreciated that a rigid or flexible printed circuit board may be used depending on requirements. For instance, a rigid printed circuit board may be used to provide a generally planar detection surface, whereas a flexible circuit board may be used to provide a detection surface having a non-planar or curved shape.

Figure 4:
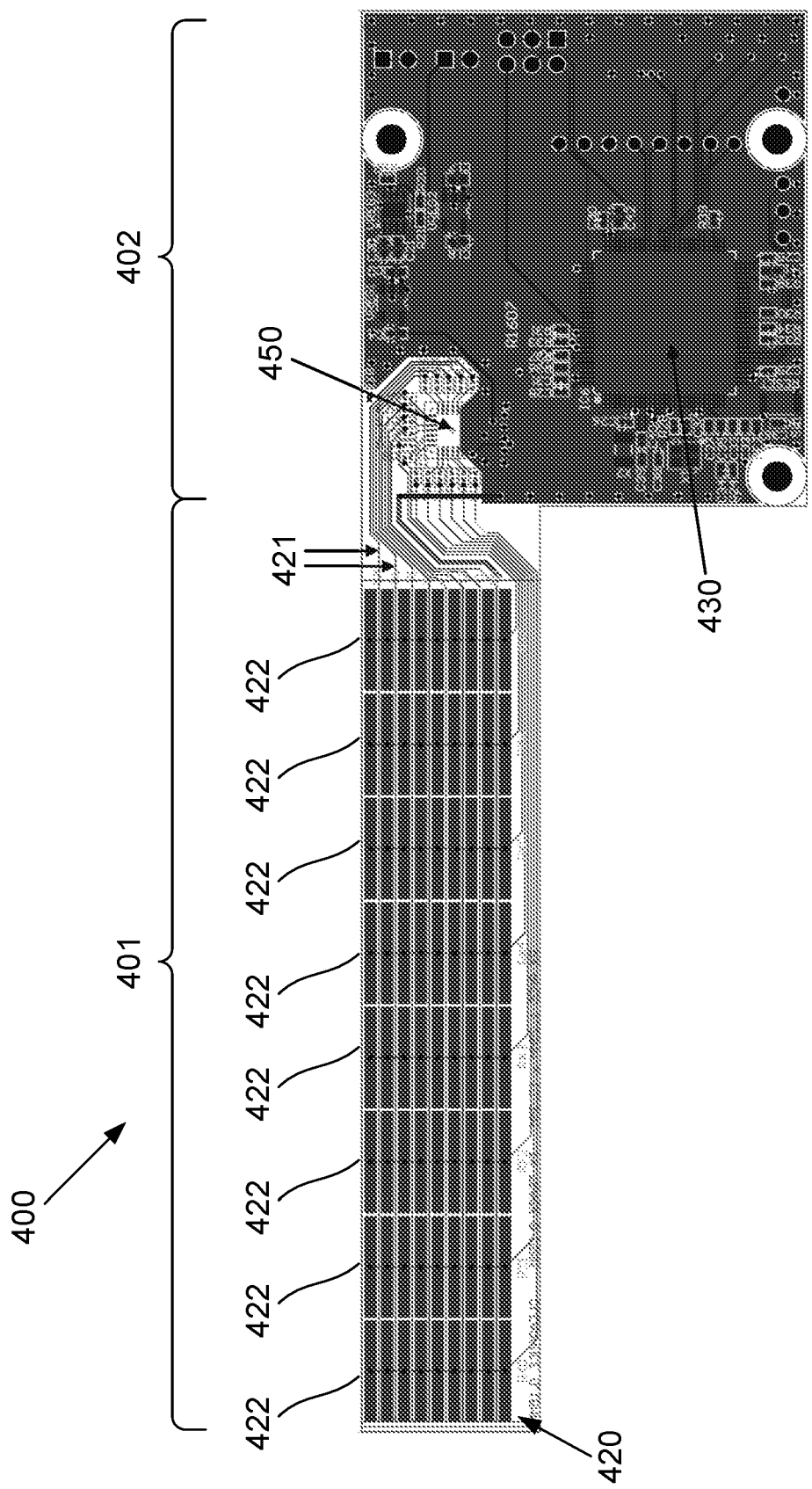
FIG. 4 is a plan view of an example of a flexible printed circuit board including an electrode grid of an embodiment of the apparatus.

FIG. 4 is another example of a printed circuit board 400 for use in the apparatus. In this case, the electrode grid 420 is arranged on a flexible part of the printed circuit board 400, indicated by a first portion 401 of the printed circuit board 400, which is designed to be curled into a cylindrical shape. The transmit electrodes 421 are provided in rows in the form of continuous thin horizontal lines, whilst the receive electrodes 422 are rectangular shaped and organised into columns. A second portion 402 of the printed circuit board 400 may be of rigid construction and include a capacitive controller integrated circuit 450 similar to the previous example, together with a microprocessor 430 for performing the analysis of the changes in capacitive signals measured by the capacitive controller integrated circuit 450.

Figure 5A:
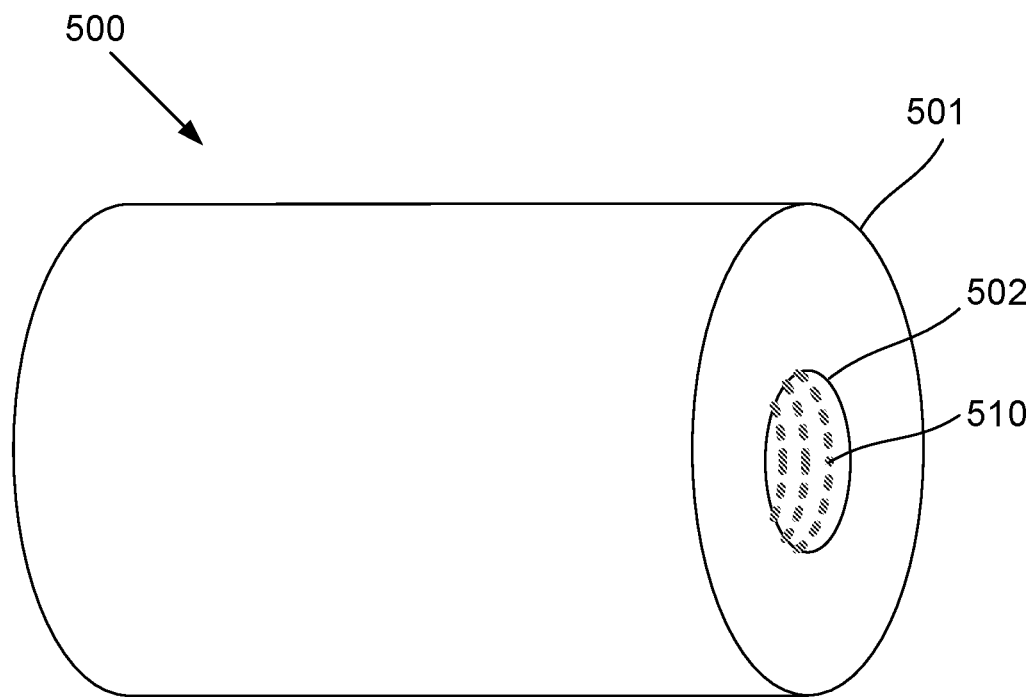
FIG. 5A is a perspective view of an example of a trap retrofitted with an embodiment of the apparatus including cylindrical detection surfaces.
Figure 5B:
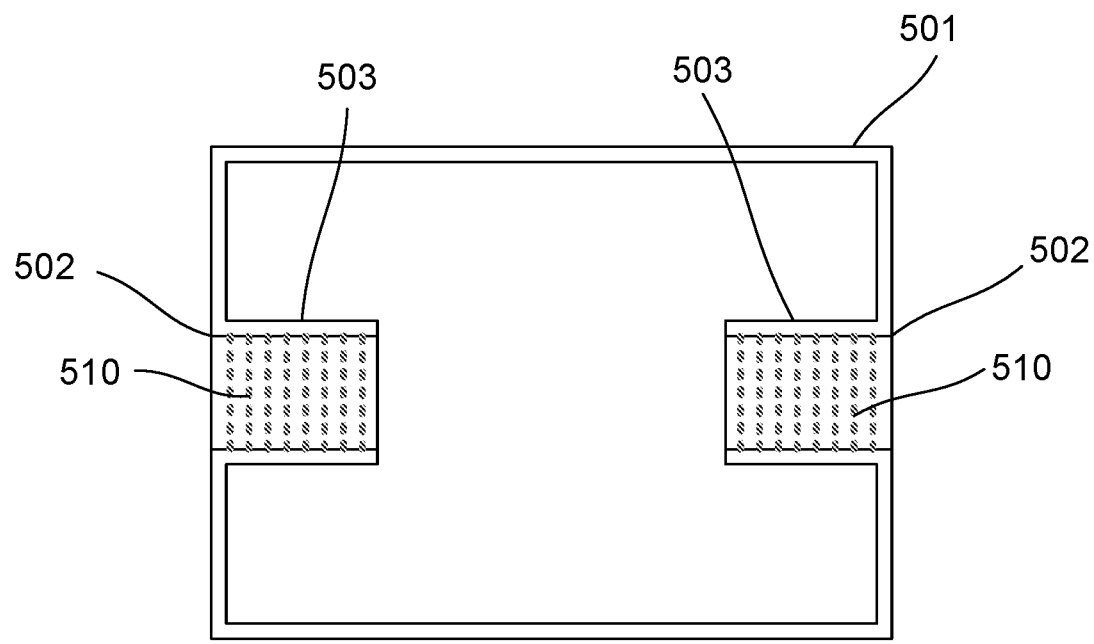
FIG. 5B is a section view of the apparatus of FIG. 5A.

An example of an embodiment of the apparatus retrofitted to a commercially available trap 500 will now be described with regard to FIGS. 5A and 5B. In this case, the trap 500 is a "Steiner-type" fruit fly trap having a plastic cylinder 501 and fruit fly entry holes 502 at either end of the cylinder 501, with inner cylindrical sections 503 provided extending from the entry holes 510 inside the cylinder 501 to substantially prevent egress of fruit flies from the trap 500.

The apparatus is retrofitted to the trap by installing cylindrical detection surfaces 510 to the inner cylindrical sections 503 in the entry holes 502. The electrode grids on these cylindrical detection surfaces 510 are provided using a flexible printed circuit board (for instance as per the example of FIG. 4), so that capacitive electrodes line the inner surface of each inner cylindrical section 503. Any arthropod entering the trap 500 from either entry hole 502 will have to land on and/or walk over capacitive electrodes as they enter. The capacitive changes can then be measured and analysed by an electronic processing device (not shown in FIG. 5A or 5B) to determine whether the arthropod is of a particular type of interest using the techniques described above. For example, the apparatus may be configured to detect, and optionally notify a user of, the presence of fruit flies based on palping behaviour across the detection surfaces 510, but to disregard capacitive changes caused by other arthropods that do not exhibit this characteristic behaviour.

Figure 6A:
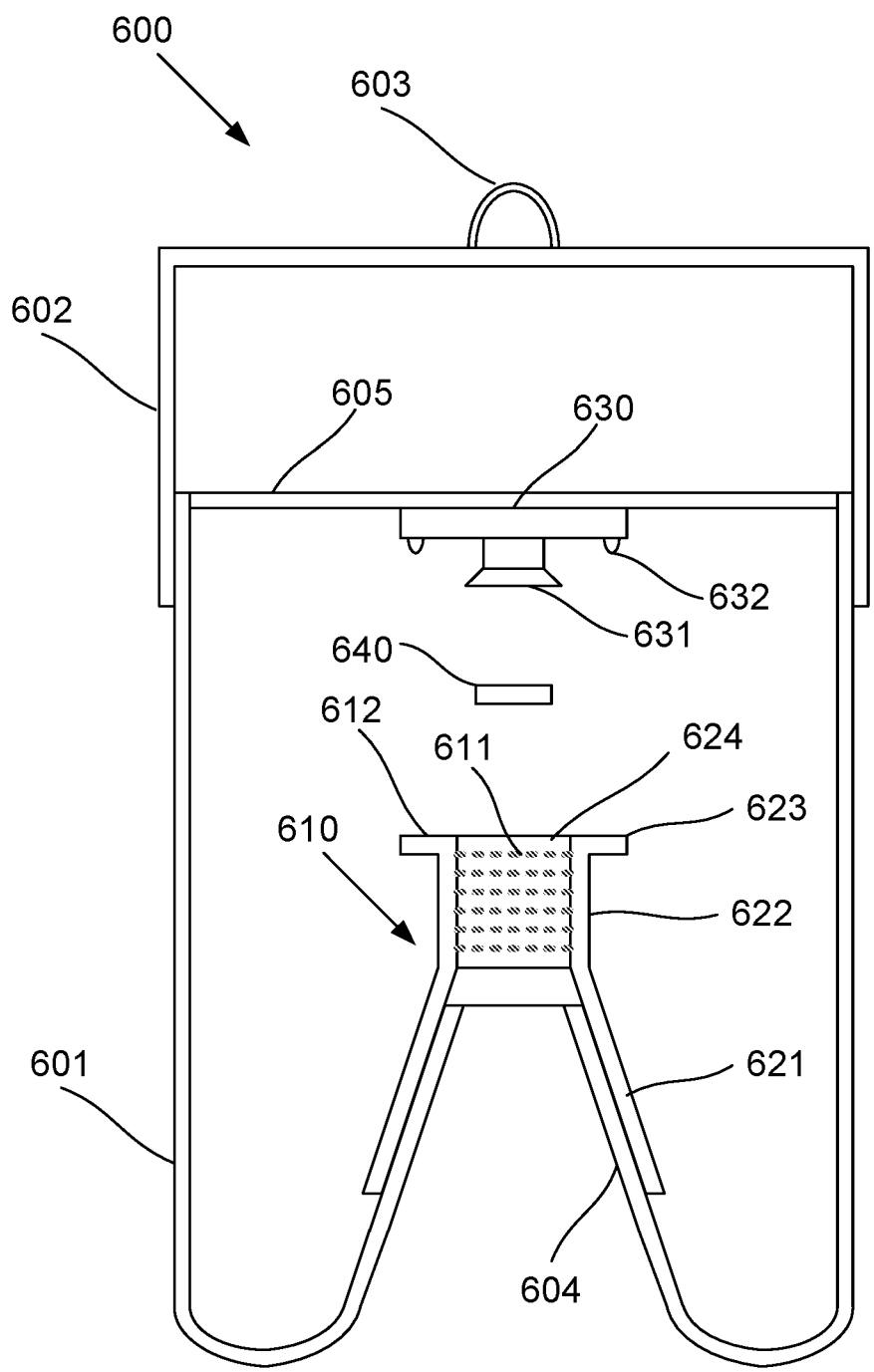
FIG. 6A is a section view of another example of a trap retrofitted with an embodiment of the apparatus including cylindrical and planar detection surfaces.
Figure 6B:
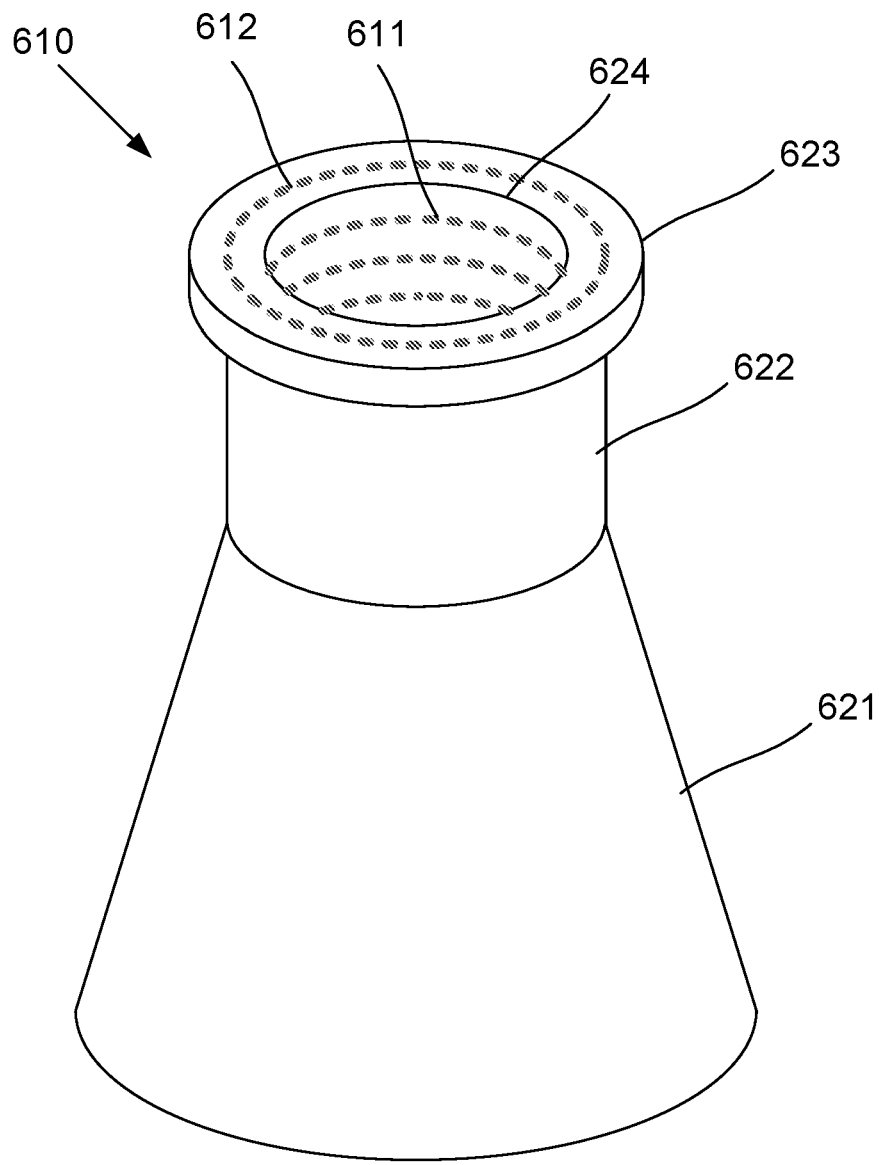
FIG. 6B is a perspective view of a component providing the detection surfaces of FIG. 6A.

Another example of an embodiment of the apparatus retrofitted to another type of commercially available trap 600 will now be described with regard to FIGS. 6A and 6B. In this case, the trap 600 includes a main body 601 which is typically formed from opaque/coloured plastic and a lid 602 which is typically formed from clear/transparent plastic. The lid 602 includes a loop 603 for allowing the trap 600 to be hung from a tree or other support in an elevated position. A funnel shaped entrance 604 is formed at the bottom of the main body 601 for allowing arthropods to easily enter the trap 600 but will substantially prevent egress from inside the main body 601.

The apparatus is retrofitted to the trap by installing a detection component 610 including detection surfaces 611, 612 into the funnel shaped entrance 604 from the inside of the trap 600. Further details of the detection component 610 can be seen in FIG. 6B. The detection component 610 includes a conical section 621 shaped to fit the funnel shaped entrance 604, a cylindrical section 622 extending from the conical section 621, and a ledge 623 surrounding an open end of the cylindrical section 622.

In this example, a primary detection surface 611 is cylindrical with electrodes on an inner surface 624 of the cylindrical section 622. This cylindrical detection surface 611 may be provided using a flexible printed circuit board as discussed above. Arthropods entering the trap from any direction via the funnel shaped entrance 604 will have to land on and/or walk over capacitance electrodes as they enter.

A secondary detection surface 612 is optionally provided on the ledge 623 and since this is planar, it may be provided using a rigid printed circuit board. Capacitance changes on the electrode pair/s on this secondary detection surface 612 could be used to detect when an arthropod is located on the ledge 623, which may be used to facilitate extended functionalities of the apparatus.

For example, returning to FIG. 6A, it will be seen that an optional camera assembly 630 may be provided in a position for capturing images of arthropods entering the trap 600. The camera assembly 630 may be supported from a support 605 attached to the main body 601 of the trap 600. The camera will include a camera lens 631 positioned to capture a suitable quality image of an arthropod on the ledge 623 and possibly on the internal surface 624 of the cylinder. The camera assembly 630 may also include light sources 632 (for example, LED flash units) to illuminate the subject. An optional optical barrier 640 may be placed in front of the camera lens 631 to block ambient light, e.g. entering through the circular opening at the top of the funnel shaped entrance 604 and detection component 610, while leaving the ledge 623 visible to the camera lens 631. Detection of a particular arthropod type of interest on the secondary detection surface 612 on the ledge 623 may be used to trigger operation of the camera assembly 630 to capture an image of the arthropod.

Although the previous examples show the apparatus provided in a trap, it will be understood that alternative embodiments of the apparatus may be configured to operate in a standalone mode without requiring a trap. In such embodiments, arthropods may land on and/or walk over the detection surface but may or may not be trapped and/or killed. The detection surface may be coloured or coated in a way that exploits arthropod behaviour to attract them to the sensing surface as described above. The detection surface could be textured, coloured or coated with a material that encourages the arthropod to exhibit a desired behaviour that generates a unique capacitance signal.

Figure 8:
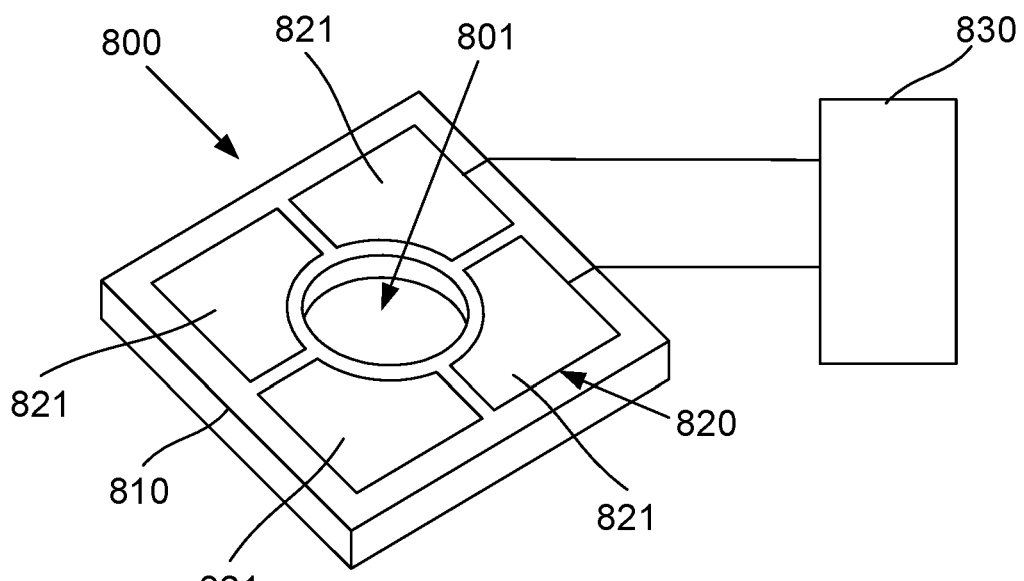
FIG. 8 is a schematic diagram of another example of an apparatus for detecting an arthropod.

Another example of an embodiment of the apparatus 800 will now be described regard to FIG. 8. It will be appreciated that this embodiment is similar to the first described embodiment of the apparatus 100, in that apparatus 800 includes a detection surface 810, an electrode grid 820 including electrodes arranged relative to the detection surface 810, and an electronic processing device 830. In this embodiment, the apparatus 800 additionally includes an opening 801 defined in the detection surface 810 and the electrode grid 820 includes at least two perimeter electrodes 821 arranged proximate to a perimeter of the opening 801.

As per the previously described embodiments, the electronic processing device 830 is configured to measure changes in electrical properties of the electrode grid 820 in response to at least one of movement and positioning of one or more body parts of an arthropod in proximity to the detection surface 810, and determine whether the arthropod is of a particular arthropod type by analysing the changes to determine whether the changes are indicative of a characteristic behaviour of the particular arthropod type. However, in this case, the electronic processing device 830 is particularly configured to measure changes in electrical properties between the at least two perimeter electrodes 821 in response to at least one of movement and positioning of one or more body parts of an arthropod in proximity to the opening 801.

Accordingly, a method for detecting an arthropod 10 using an apparatus 800 as described above will remain substantially as shown in FIG. 2, but with the step of measuring changes in electrical properties of the electrode grid at step 220 including measuring changes in electrical properties between the at least two perimeter electrodes 821 in response to at least one of movement and positioning of one or more body parts of an arthropod in proximity to the opening 801.

It will be appreciated that the changes associated with the at least two perimeter electrodes may be indicative of a characteristic behaviour involving the arthropod interacting with the opening. In this regard, some arthropod types have been observed as exhibiting unique behaviours involving interactions with a hole or other opening in a surface. For example, a female fruit fly often inserts its ovipositor into small holes that it finds, or a beetle is inclined to seek out holes and crawl through them.

Accordingly, the characteristic behaviour used to determine whether the arthropod is of a particular arthropod type may include a characteristic movement of a body part of the arthropod relative to the opening. In some non-limiting examples, the characteristic behaviour may include inserting one or more body parts of the arthropod into the opening, inserting an ovipositor of the arthropod into the opening, or the entire arthropod moving through the opening.

It should be appreciated that the opening 801 may be provided with a range of different shapes, which may be selected, for example, depending on the size and characteristic behaviours of particular arthropod types to be targeted by the apparatus 800. For instance, the opening may be in the form of a circle, a square, a rectangle, or a slot. In addition, although only a single opening 801 has been mentioned above, the apparatus 800 may include a plurality of openings 801, which may optionally include openings 801 of different shapes and/or sizes. In some embodiments, the openings 801 may be arranged in a pattern across the detection surface 810 or may be strategically positioned on the detection surface 810 depending on the expected movements of arthropods relative to the detection surface 810 in use.

In some implementations of the above discussed apparatus 800, the at least two perimeter electrodes 821 may include a pair of capacitive electrodes arranged on opposing sides of the perimeter of the opening 801. An opposing pair of capacitive electrodes may be positioned around or near the perimeter of the opening 801 in such a manner so as to create an electric field across the opening 801. The electric field would be disrupted when body parts of arthropods are inserted into the opening 801 or when entire arthropods pass through the opening 801, or when an arthropod exhibits characteristic behaviours in the opening 801. Such an arrangement will allow the processing device 830 to measure capacitance changes between the opposing capacitive electrode pairs associated with the opening 801 which can be used to detect characteristic behaviours exhibited by an arthropod interacting with the opening as discussed above.

In one implementation example, one or more capacitive electrode pairs may be located on opposite sides of a hole in a printed circuit board, so that an electric field may be created within the hole. This electric field could be disrupted when an arthropod inserted a body part into the hole, or if the whole arthropod crawled through the hole.

Figure 9:
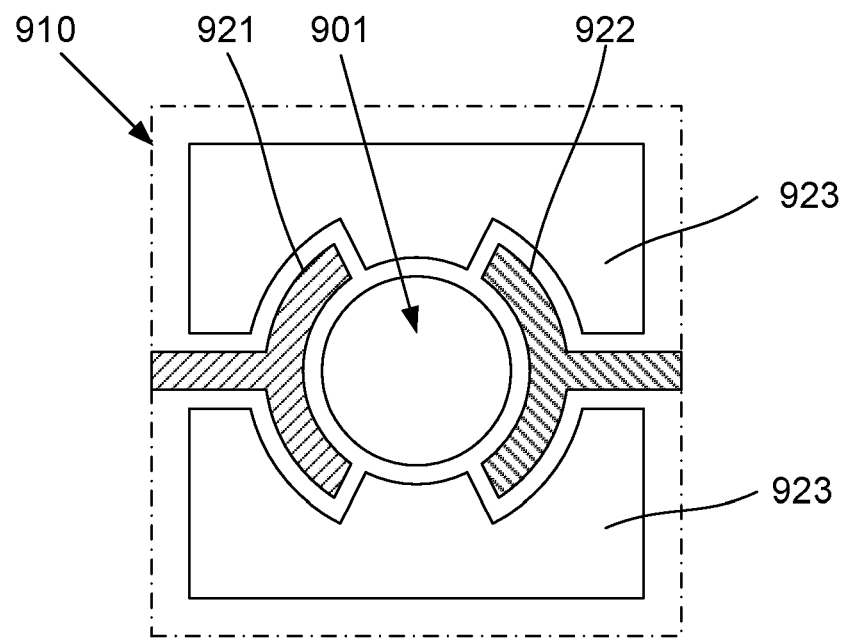
FIG. 9 is a plan view of a portion of an example of an apparatus including an opening and a single capacitive electrode pair.

A specific example of an arrangement of a capacitive electrode pair proximate to an opening will now be described with regard to FIG. 9, which shows a portion of a detection surface 910 having a opening in the form of a hole 901 defined through it. In this case, there is a single capacitive electrode pair 921, 922, including a transmit electrode 921 and a receive electrode 922, positioned on opposite sides of the hole 901. In this example, additional conductors 923 are arranged about the hole and connected to ground, to thereby constrain the electric field between the capacitive electrode pair 921, 922 across the hole 901.

In use, the dielectric properties of the space between the capacitive electrodes 921, 922 would change when the arthropod was introduced into the space (e.g. from purely air to air+arthropod body, e.g. purely water to water+arthropod body). This would change the capacitance measured between the two electrodes 921, 922, and this capacitance change may in turn be analysed by the processing device. In one example, a simple threshold may be applied to the measured capacitance to determine when an arthropod body part is present. In addition, the magnitude of the change in measured capacitance could potentially indicate the size of the body part that was inserted. Otherwise, it will be appreciated that any of analysis techniques as described above may be applied when analysing the capacitance changes.

Figure 10:
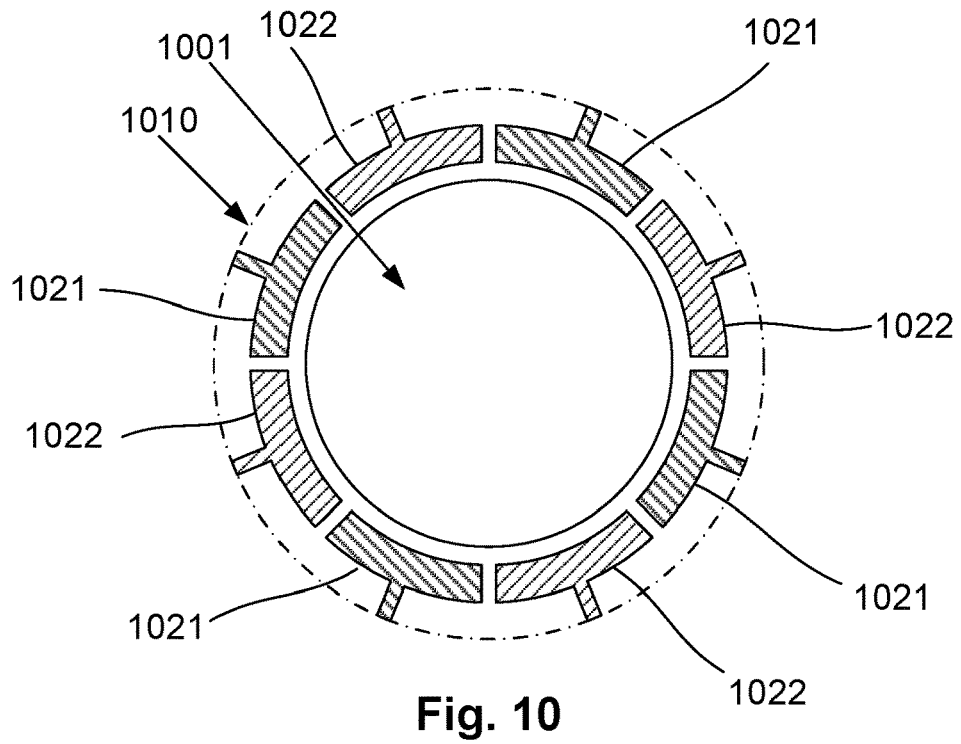
FIG. 10 is a plan view of a portion of an example of an apparatus including an opening and multiple capacitive electrode pairs.

In some implementations, the electrode grid may include a plurality of pairs of capacitive electrodes arranged around the perimeter of the opening. The capacitive electrodes in each pair may be arranged in opposing positions around the opening. A specific example of such an arrangement will now be described with regard to FIG. 10, which shows a portion of a detection surface 1010 having a opening in the form of a hole 1001 defined through it. In this embodiment, the electrode grid includes a multitude of transmit/receive electrodes 1021, 1022 arranged around the perimeter of the hole 1001. Variations in measured capacitance from each transmit/receive electrode pair combination could potentially indicate the location within the hole 1001 where the body part of an arthropod is inserted, and/or the size of the body part.

Figure 11:
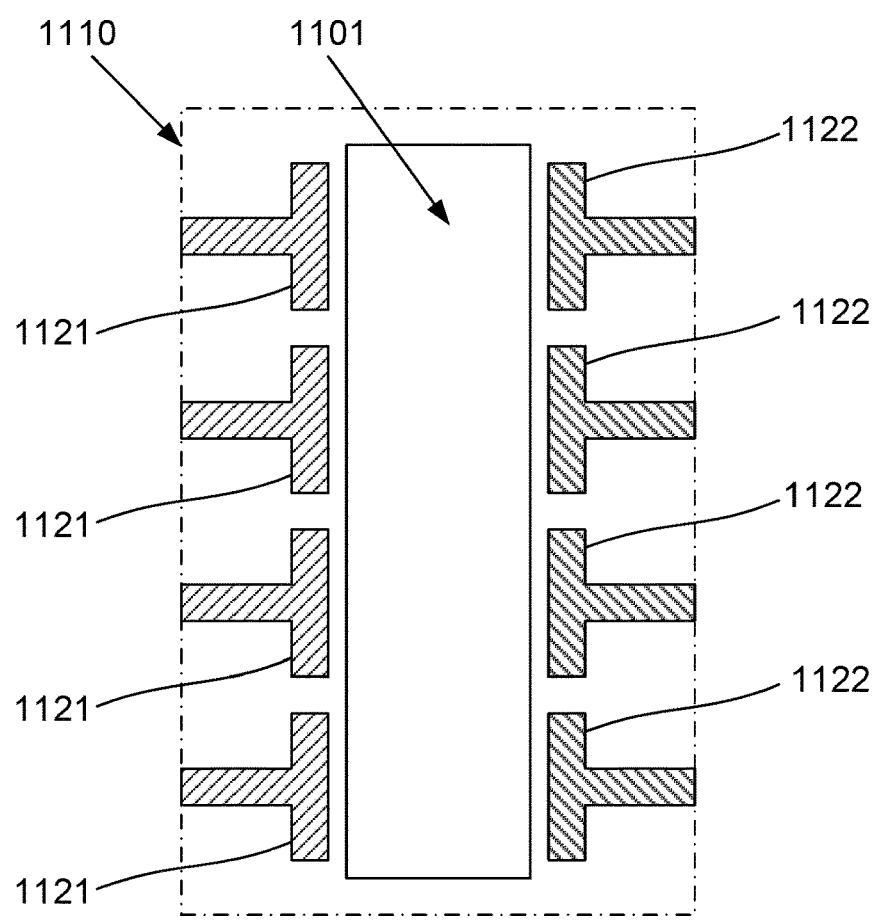
FIG. 11 is a plan view of a portion of another example of an apparatus including an opening and multiple capacitive electrode pairs.

Another example embodiment of an opening with a shape other than a circular hole will now be described with regard to FIG. 11, which shows a portion of a detection surface 1110 in which an opening in the form of a rectangular slot 1101 is defined. In this case, four pairs of transmit/receive capacitive electrodes 1121, 1122 are arranged with the respective transmit electrode 1121 and receive electrode 1122 of each pair being positioned on opposing sides of the slot 1101. As per the previous examples, electric fields may be created between the electrode pairs and capacitance changes due to arthropod interactions with the slot 1101 may be measured and analysed by the processing device in the determination of whether the arthropod is of a particular arthropod type.

As described previously, the electrode grid may be provided on a printed circuit board, and in some embodiments of the apparatus having an opening, at least two perimeter electrodes may be provided on a layer of a multi-layer printed circuit board. For instance, a capacitive electrode pair may be provided on an internal layer of a multi-layer printed circuit board to thereby allow an electric field to be created at an intermediate depth inside the opening, such that capacitive changes may only be detected when a body part of an arthropod is inserted to that intermediate depth.

In some implementations, the at least two perimeter electrodes may include at least some electrodes provided on different layers of the multi-layer printed circuit board. For instance, the perimeter electrodes could be located on the top and/or bottom, and/or on one or more internal layers within the multi-layer printed circuit board. In the case where the perimeter electrodes are in the form of capacitive electrode pairs, this may allow for detection of different capacitive changes between electrode pairs depending on a depth of insertion of a body part of an arthropod into the opening.

Figure 12:
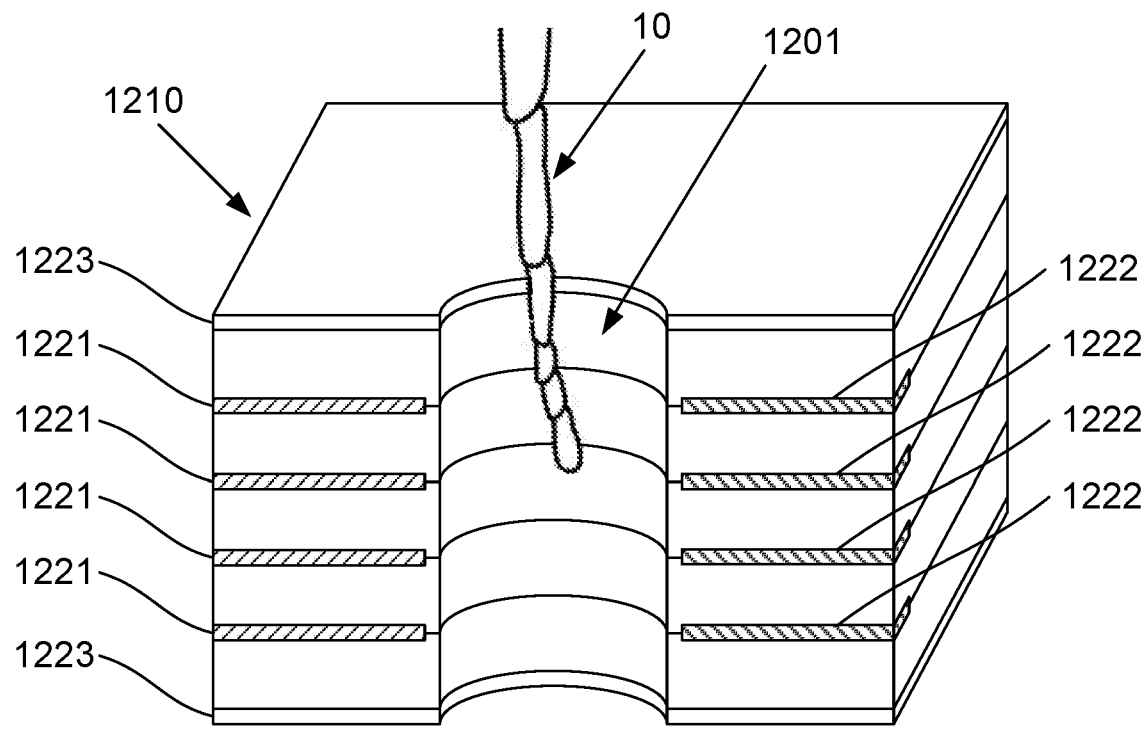
FIG. 12 is a perspective view of a portion of another example of an apparatus including an opening and multiple capacitive electrode pairs provided on layers of a multi-layer printed circuit board; and, FIG. 13 is a perspective view of an example of a cylindrical detection surface with capacitive electrode pairs arranged around a central hole.

FIG. 12 illustrates an example of an arrangement of capacitive electrode pairs 1221, 1222 about an opening 1201 defined in a portion of a detection surface 1201. In this case, the capacitive electrode pairs 1221, 1222 are formed on four internal layers within a multi-layer printed circuit board, to thereby allow capacitive changes to be detected at four incremental depths within the opening 1201.

Accordingly, in the event that a body part of an arthropod 10 (such as a tarsus or ovipositor, for example) is partially inserted into the opening as depicted in FIG. 12, this may only cause capacitance changes in some of the capacitive electrode pairs 1221, 1222 depending on the depth of insertion. The capacitance changes for each capacitive electrode pair 1221, 1222 may also vary depending on the size and position of the tarsus within the opening 1201. These capacitance changes may be measured and analysed by the processing device to determine characteristic behaviours associated with the partial insertion of a body part, and these may be used to distinguish between different arthropod types as discussed above.

In some embodiments, the apparatus may include conductors on other layers of the multi-layer printed circuit board for modifying the electrical properties between the at least two perimeter electrodes. For example, as shown in the example of FIG. 12, conductors 1223 may also be provided on layers of the multi-layer printed circuit board above and below the capacitive electrodes. These conductors 1223 may be connected to ground to constrain the electric fields that affect the capacitance measurements to the space within the opening 1201 only.

As discussed above, some embodiments of the apparatus may include a cylindrical detection surface, which may be provided, for instance, by forming the electrode grid on a flexible printed surface board. Such a cylindrical detection surface will define a central hole, and it will be appreciated that electrodes may be arranged around the central hole in an analogous manner as described above for openings defined in the detection surface. For example, the electrode grid may include a pair of capacitive electrodes arranged on opposing sides of the hole, and capacitance changes between this capacitive electrode pair may be indicative of positioning or movement of one or more body parts of an arthropod relative to the hole defined by the cylinder.

Figure 13:
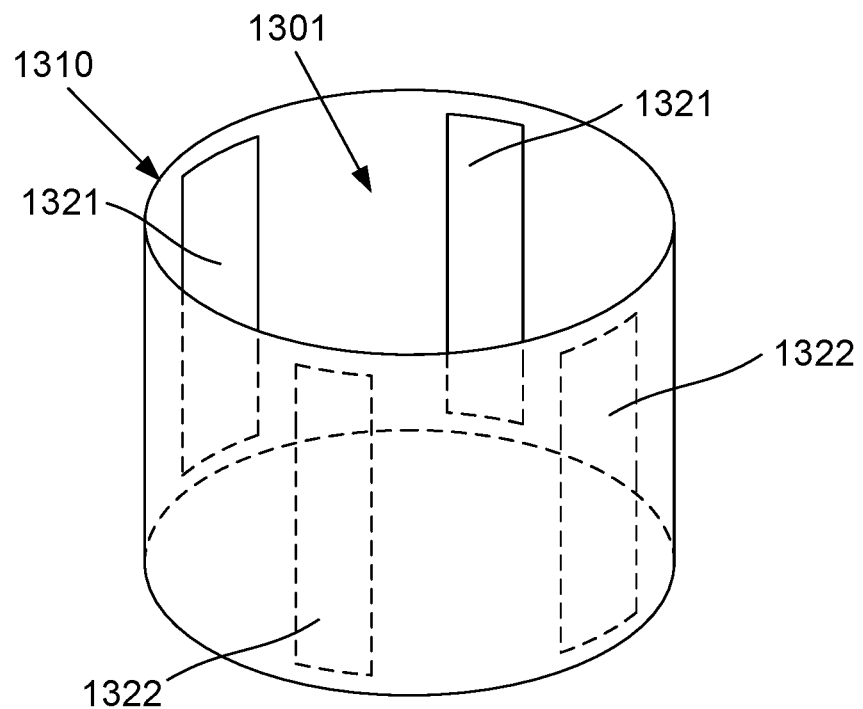

An example embodiment of such a cylindrical detection surface is shown in FIG. 13, where the cylindrical detection surface 1310 defines a central hole 1301, and pairs of capacitive electrodes 1321, 1322 are provided on the cylindrical detection surface 1310 in opposing arrangements around the hole. Such an arrangement may be formed by locating receive electrodes 1321 and transmit electrodes 1322 on a flexible printed circuit board so that they are opposite each other when the flexible printed circuit board is formed into a cylinder. This embodiment may be appropriate for detecting when large arthropods (e.g. large moths such as *helicoverpa*) pass entirely through the hole 1301, or exhibit a characteristic behaviour while it is in the hole 1301, for example a moth repeatedly impacting the sides of the hole 1301.

Although a cylindrical detection surface has been exemplified in the above embodiment, it should also be understood that similar techniques for arranging electrodes about an opening may be applied to any non-planar detection surface having a shape that defines an internal opening or hole, such as a frustoconical detection surface or an elongated prismatic detection surface.

A further extension of the above described techniques may also be provided in recognition of the fact that many arthropods may exhibit characteristic behaviours which involve depositing material (e.g. saliva, regurgitations, eggs) onto a detection surface or into an opening within the detection surface. Such deposits could manifest as step changes in the electrical signals measured between the electrodes, and the signal changes could potentially remain after the arthropod has left the detection surface. These signal changes could be permanent or the signals could return to their original state over a period of time (e.g. saliva will dry out over time). Accordingly, changes in electrical signals that are indicative of deposited material could also be used to indicate characteristic behaviours of different types of arthropods.

Thus, in one embodiment the changes in electrical properties may include changes in response to a material being deposited by the arthropod in proximity to the detection surface and the method of determining whether the arthropod is of a particular arthropod type may further include analysing the changes to determine whether the changes are indicative of a characteristic behaviour including depositing material.

Whilst the above described examples have been described in the context of embodiments of an apparatus having an electrode grid including electrodes arranged relative to a detection surface, it should be appreciated that the above described techniques may be implemented in more general forms of the apparatus including a number of electrodes in a variety of different arrangements.

Accordingly an apparatus for detecting an arthropod may include a number of electrodes and an electronic processing device configured to: measure changes in electrical properties of the electrodes in response to at least one of movement and positioning of one or more body parts of an arthropod in proximity to the electrodes; and determine whether the arthropod is of a particular arthropod type by analysing the changes to determine whether the changes are indicative of a characteristic behaviour of the particular arthropod type.

A corresponding method for detecting an arthropod may thus be performed using an apparatus including a number of electrodes and an electronic processing device, wherein the method includes, in the electronic processing device: measuring changes in electrical properties of the electrodes in response to at least one of movement and positioning of one or more body parts of an arthropod in proximity to the electrodes; and determining whether the arthropod is of a particular arthropod type by analysing the changes to determine whether the changes are indicative of a characteristic behaviour of the particular arthropod type.

In any event, it will be appreciated that embodiments of the apparatus enables the detection of a particular arthropod type by distinguishing between different arthropod types based on their characteristic behaviours. This is facilitated by measuring changes in electrical properties between electrodes, such as capacitive changes between pairs of capacitive electrodes. It is possible to sense particular body parts of an arthropod moving across a detection surface of the apparatus, where the movements of the body parts will result in unique electrical property changes. By analysing these changes, characteristic behaviours of particular arthropod types can be identified, to thereby allow the presence of an arthropod of a particular arthropod type to be detected.

The electrodes may be provided in the form of an electrode grid arranged on the detection surface, which can be planar, curved or made into three dimensional shapes to offer a range of practical configurations to target different arthropod types. In some implementations, an opening may be defined in the detection surface with electrodes arranged proximate to the perimeter of the opening, to thereby allow arthropod interactions with the opening to be detected. The apparatus may be used with or without a trap (standalone), and may be extended to include functionality for triggering a camera, for example to capture an image of a specific arthropod type but to not capture images for other arthropod types. Furthermore, the apparatus may be capable of sending a notification, which may include an image captured by the camera, to a user to enable near real-time monitoring for the targeted arthropod type.

Throughout this specification and claims which follow, unless the context requires otherwise, the word "comprise", and variations such as "comprises" or "comprising", will be understood to imply the inclusion of a stated integer or group of integers or steps but not the exclusion of any other integer or group of integers.

Persons skilled in the art will appreciate that numerous variations and modifications will become apparent. All such variations and modifications which become apparent to persons skilled in the art, should be considered to fall within the spirit and scope that the invention broadly appearing before described.

The claims defining the invention are as follows:

1. A method for detecting an arthropod, the method being performed using an apparatus including a detection surface, an electrode grid including electrodes arranged relative to the detection surface, and an electronic processing device, wherein the method includes, in the electronic processing device:
    a) measuring changes in electrical properties of the electrode grid in response to at least one of movement and positioning of one or more body parts of an arthropod in proximity to the detection surface; and,
    b) determining whether the arthropod is of a particular arthropod type by analysing the changes to determine whether the changes are indicative of a characteristic behaviour of the particular arthropod type, wherein the characteristic behaviour includes a characteristic movement of a body part of the arthropod relative to the detection surface.

2. A method according to claim 1, wherein at least some of the electrodes are capacitive electrodes and the changes include capacitance changes between one or more pairs of the capacitive electrodes, and wherein the method includes measuring one or more capacitance signals including the capacitance changes.

3. A method according to claim 2, wherein the method includes at least one of:
    a) measuring changes in a capacitance signal over time; and,
    b) analysing the capacitance changes by comparing the capacitance signal to a signal pattern that is known to be indicative of the characteristic behaviour.

4. A method according to claim 1, wherein the characteristic movement includes at least one of:
    a) walking on the detection surface with tarsi of the arthropod;
    b) dragging on the detection surface with an abdomen of the arthropod;
    c) palping on the detection surface with a mouthpart of the arthropod;
    d) drumming on the detection surface with antennae of the arthropod; and,
    e) ovipositing on the detection surface with an ovipositor of the arthropod.

5. A method according to claim 1, wherein the method includes at least one of:
    a) determining a position of the detected arthropod relative to the detection surface based on the changes; and,
    b) determining an orientation of the detected arthropod relative to the detection surface based on the changes.

6. A method according to claim 1, wherein the apparatus includes a camera and the method includes triggering the camera in response to a successful determination that the arthropod is of the particular arthropod type.

7. A method according to claim 1, wherein the apparatus includes an opening defined in the detection surface and the electrode grid includes at least two perimeter electrodes arranged proximate to a perimeter of the opening, and wherein measuring changes in the electrical properties of the electrode grid includes measuring changes in electrical properties between the at least two perimeter electrodes in response to at least one of movement and positioning of one or more body parts of an arthropod in proximity to the opening, wherein the at least two perimeter electrodes includes at least one pair of capacitive electrodes arranged on opposing sides of the perimeter of the opening, and wherein the method includes measuring capacitance changes between the at least one pair of capacitive electrodes.

8. A method according to claim 7, wherein the characteristic behaviour includes at least one of:
    a) a characteristic movement of a body part of the arthropod relative to the opening;
    b) inserting one or more body parts of the arthropod into the opening;
    c) inserting an ovipositor of the arthropod into the opening; and,
    d) the entire arthropod moving through the opening.

9. A method according to claim 1, wherein the changes in electrical properties include changes in response to a material being deposited by the arthropod in proximity to the detection surface and wherein the method includes analysing the changes to determine whether the changes are indicative of a characteristic behaviour including depositing material.

10. An apparatus for detecting an arthropod, the apparatus including:
    a) a detection surface;
    b) an electrode grid including electrodes arranged relative to the detection surface; and, c) an electronic processing device configured to:
  i) measure changes in electrical properties of the electrode grid in response to at least one of movement and positioning of one or more body parts of an arthropod in proximity to the detection surface; and,
  ii) determine whether the arthropod is of a particular arthropod type by analysing the changes to determine whether the changes are indicative of a characteristic behaviour of the particular arthropod type, wherein the characteristic behavior includes a characteristic movement of a body part of the arthropod relative to the detection surface.

11. An apparatus according to claim 10, wherein the electrode grid includes capacitive electrodes and the electronic processing device is configured to measure capacitance changes between one or more pairs of the capacitive electrodes, and wherein the electrode grid is configured so that the capacitance changes occur in response to one or more body parts of the arthropod being positioned between the one or more pairs of the capacitive electrodes.

12. An apparatus according to claim 10, wherein the electrode grid at least one of:
  a) includes a first set of electrodes arranged in rows and a second set of electrodes arranged in columns; and,
  b) is provided on a flexible printed circuit board.

13. An apparatus according to claim 10, wherein the detection surface includes:
  a) a surface that is at least one of:
    i) substantially planar;
    ii) curved;
    iii) cylindrical;
    iv) frustoconical; and,
    v) spherical; and,
  b) a cylindrical detection surface defining a central hole and the electrode grid includes a pair of capacitive electrodes arranged on opposing sides of the hole.

14. An apparatus according to claim 10, wherein the detection surface at least one of:
  a) includes a combination of interconnected surfaces each including electrodes;
  b) is coated with a material selected to at least one of:
    i) attract the particular arthropod type; and,
    ii) stimulate a characteristic behaviour of the particular arthropod type; and,
  c) is provided proximate to an entrance to a trap.

15. An apparatus according to claim 10, wherein the apparatus includes at least one of:
  a) a camera, the electronic processing device being configured to trigger the camera in response to a successful determination that the detected arthropod is of the particular arthropod type;
  b) a sensor, the electronic processing device being configured to trigger the sensor in response to a successful determination that the detected arthropod is of the particular arthropod type; and,
  c) a detection sensor for detecting the presence of the arthropod, the electronic processing device being configured to start measuring changes in electrical properties of the electrode grid in response to activation of the detection sensor.

16. An apparatus according to claim 10, wherein the apparatus includes an actuator, the electronic processing device being further configured to trigger the actuator in response to a successful determination that the detected arthropod is of the particular arthropod type.

17. An apparatus according to claim 10, wherein the electronic processing device is configured to generate a notification in response to a successful determination that the detected arthropod is of the particular arthropod type, and wherein the electronic processing device includes a communications module for transmitting the notification to another electronic processing device.

18. An apparatus according to claim 10, wherein the apparatus includes an opening defined in the detection surface and the electrode grid includes at least two perimeter electrodes arranged proximate to a perimeter of the opening, and wherein the electronic processing device is configured to measure changes in electrical properties between the at least two perimeter electrodes in response to at least one of movement and positioning of one or more body parts of an arthropod in proximity to the opening, and wherein the at least two perimeter electrodes includes a pair of capacitive electrodes arranged on opposing sides of the perimeter of the opening.

19. An apparatus according to claim 18, wherein at least one of:
  a) the at least two perimeter electrodes includes a plurality of pairs of capacitive electrodes arranged about the perimeter of the opening;
  b) the at least two perimeter electrodes are provided on a layer of a multi-layer printed circuit board;
  c) the at least two perimeter electrodes include at least some electrodes provided on different layers of the multi-layer printed circuit board; and,
  d) the apparatus includes conductors on other layers of the multi-layer printed circuit board for modifying the electrical properties between the at least two perimeter electrodes.

20. A method for detecting an arthropod, the method being performed using an apparatus including a number of electrodes and an electronic processing device, wherein the method includes, in the electronic processing device:
  measuring changes in electrical properties of the electrodes in response to at least one of movement and positioning of one or more body parts of an arthropod in proximity to the electrodes; and,
  determining whether the arthropod is of a particular arthropod type by analysing the changes to determine whether the changes are indicative of a characteristic behaviour of the particular arthropod type, wherein the characteristic behavior includes a characteristic movement of a body part of the arthropod relative to the detection surface.

* * * * *